(12) United States Patent
Toda

(10) Patent No.: US 12,334,659 B2
(45) Date of Patent: Jun. 17, 2025

(54) CONNECTION BODY AND HARNESS

(71) Applicant: JAPAN AVIATION ELECTRONICS INDUSTRY, LIMITED, Tokyo (JP)

(72) Inventor: Kentaro Toda, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 453 days.

(21) Appl. No.: 17/970,829

(22) Filed: Oct. 21, 2022

(65) Prior Publication Data

US 2023/0187855 A1  Jun. 15, 2023

(30) Foreign Application Priority Data

Dec. 9, 2021 (JP) .................................. 2021-199793

(51) Int. Cl.
*H01R 12/62* (2011.01)
*H01R 12/71* (2011.01)
*H05K 1/02* (2006.01)
*H05K 1/11* (2006.01)

(52) U.S. Cl.
CPC ........... *H01R 12/62* (2013.01); *H01R 12/714* (2013.01); *H05K 1/0216* (2013.01); *H05K 1/117* (2013.01); *H05K 2201/09045* (2013.01); *H05K 2201/09227* (2013.01); *H05K 2201/094* (2013.01); *H05K 2201/09409* (2013.01); *H05K 2201/09672* (2013.01); *H05K 2201/10189* (2013.01); *H05K 2201/10356* (2013.01)

(58) Field of Classification Search
CPC ....... H01R 12/62; H01R 12/714; H05K 1/114
See application file for complete search history.

(56) References Cited

U.S. PATENT DOCUMENTS

| | | | |
|---|---|---|---|
| 6,585,528 B1 * | 7/2003 | Lin ..................... | H01R 13/6658 439/942 |
| 7,922,520 B2 * | 4/2011 | Mizukami ........ | H01R 13/65912 439/493 |
| 9,437,964 B2 * | 9/2016 | Hwang .............. | H01R 13/5812 |
| 9,572,246 B2 * | 2/2017 | Tanaka .............. | H01R 13/6473 |
| 10,804,656 B2 | 10/2020 | Osaka et al. | |
| 10,957,997 B2 * | 3/2021 | Qiao ..................... | H01R 12/50 |

(Continued)

FOREIGN PATENT DOCUMENTS

| | | |
|---|---|---|
| JP | 2003323923 A | 11/2003 |
| JP | 2009266474 A | 11/2009 |

(Continued)

*Primary Examiner* — Neil Abrams
(74) *Attorney, Agent, or Firm* — Holtz, Holtz & Volek PC

(57) ABSTRACT

A connection body comprises a body having upper and lower surfaces, a first path and a second path. The first path has a first wired portion configured to be connected to a first core wire of a cable structure and a first terminal portion coupled to the first wired portion by a first coupling portion. The first wired portion, the first terminal portion and the first coupling portion are formed on the upper surface of the body. The second path has a second wired portion configured to be connected to a second core wire of the cable structure and a second terminal portion coupled to the second wired portion by a second coupling portion. The second wired portion is formed on the upper surface of the body. The second terminal portion is formed on the lower surface of the body.

8 Claims, 16 Drawing Sheets

(56) References Cited

U.S. PATENT DOCUMENTS

| | | | | |
|---|---|---|---|---|
| 11,742,619 B2* | 8/2023 | Toda | .................. | H01R 13/6471 |
| | | | | 439/108 |
| 2013/0264107 A1* | 10/2013 | Meyers | .............. | H01R 13/6466 |
| | | | | 174/268 |
| 2014/0193986 A1* | 7/2014 | Venaleck | ............... | H01R 13/03 |
| | | | | 174/254 |
| 2020/0395694 A1* | 12/2020 | Toda | ........................ | H01R 4/24 |
| 2021/0344143 A1 | 11/2021 | Toda | | |
| 2023/0187855 A1* | 6/2023 | Toda | .................. | H01R 13/6474 |
| | | | | 439/497 |
| 2024/0222923 A1* | 7/2024 | Yang | ........................ | H05K 1/18 |

FOREIGN PATENT DOCUMENTS

| | | |
|---|---|---|
| JP | 2019102350 A | 6/2019 |
| JP | 2020092148 A | 6/2020 |

* cited by examiner

1

CONNECTION BODY AND HARNESS

CROSS REFERENCE TO RELATED APPLICATIONS

This application is based on and claims priority under 35 U.S.C. § 119 to Japanese Patent Applications No. JP 2021-199793 filed Dec. 9, 2021, the content of which is incorporated herein in its entirety by reference.

BACKGROUND OF THE INVENTION

This invention relates to a connection body configured to be connected to a cable structure.

For example, this type of connection body is disclosed in JP2020-092148A (Patent Document 1), the content of which is incorporated herein by reference.

As shown in FIG. 29, Patent Document 1 discloses a circuit board (connection body) 90 which is configured to connect a cable (cable structure) 98 and a connector 99 with each other. The connection body 90 is connectable to a front end (positive X-side end) of the cable structure 98. The cable structure 98 comprises a plurality of coated wires 982. As shown in FIGS. 29 and 30, the connection body 90 has an upper surface 92 and a lower surface 94 each of which is formed with a plurality of conductive patterns 96. The conductive patterns 96 of the upper surface 92 and the lower surface 94 are connected to terminals 992 of the connector 99, respectively. Thus, the connector 99 is connected to both of the upper surface 92 and the lower surface 94 of the connection body 90. Moreover, the coated wires 982 of the cable structure 98 are connected to the conductive patterns 96 of the upper surface 92 and the lower surface 94, respectively.

When a cable structure is connected to a connection body as disclosed in Patent Document 1, a cable fixing process such as soldering is required for each of upper and lower surfaces of the connection body. Thus, a process for connecting the cable structure to the connection body is cumbersome.

SUMMARY OF THE INVENTION

It is therefore an object of the present invention to provide a connection body which has upper and lower surfaces both configured to be connected to an object such as a connector and which is easily connectable to a cable structure.

An aspect of the present invention provides a connection body configured to be connected to a front end of a cable structure in a front-rear direction, the cable structure comprising one or more first core wires and one or more second core wires.

The connection body comprises a body made of insulator, one or more first paths each made of conductor and one or more second paths each made of conductor. The body has an upper surface, a lower surface and a rear surface. The upper surface and the lower surface are located at opposite sides of the body in an upper-lower direction perpendicular to the front-rear direction. The rear surface faces rearward and couples the upper surface and the lower surface to each other in the upper-lower direction. Each of the first paths has a first wired portion, a first terminal portion and a first coupling portion. The first wired portions are connected to the first core wires of the cable structure, respectively, under a connected state where the connection body is connected to the cable structure. The first wired portions, the first terminal portions and the first coupling portions are formed on the upper surface of the body. Each of the first terminal portions is located forward of the first wired portion. Each of the first coupling portions couples the first wired portion and the first terminal portion to each other. Each of the second paths has a second wired portion, a second terminal portion and a second coupling portion. The second wired portions are connected to the second core wires of the cable structure, respectively, under the connected state. The second wired portions are formed on the upper surface of the body. The second terminal portions are formed on the lower surface of the body. Each of the second terminal portions is located forward of the second wired portion. Each of the second coupling portions extends on the upper surface, the rear surface and the lower surface and couples the second wired portion and the second terminal portion to each other.

According to an aspect of the present invention, the first terminal portions of the connection body are provided on the upper surface of the connection body, while the second terminal portions of the connection body are provided on the lower surface of the connection body. The first terminal portions and the second terminal portions are connectable to an object such as a connector. Thus, both of the upper and lower surfaces of the connection body of an aspect of the present invention are configured to be connected to the object. In contrast, the first wired portions and the second wired portions of the connection body are provided on the upper surface of the connection body. According to this arrangement, when the first core wires and the second core wires of the cable structure are connected to the first wired portions and the second wired portions, respectively, a cable fixing process such as soldering will be performed only for the upper surface of the connection body. Thus, an aspect of the present invention provides a connection body which has upper and lower surfaces both configured to be connected to an object such as a connector and which is easily connectable to a cable structure.

In particular, upper and lower parts of each of the second paths of an aspect of the present invention can be vertically coupled to each other not via a through-hole but via a part of the second path formed on the rear surface of the connection body. According to this structure, the impedance of the second paths can be easily adjusted. In addition, since the upper and lower surfaces of the connection body do not need to be formed with openings of a through-hole, flexibility in design of the first paths and the second paths is improved. For example, the first paths and the second paths can be arranged with narrow pitch.

An appreciation of the objectives of the present invention and a more complete understanding of its structure may be had by studying the following description of the preferred embodiment and by referring to the accompanying drawings.

Figure 1:
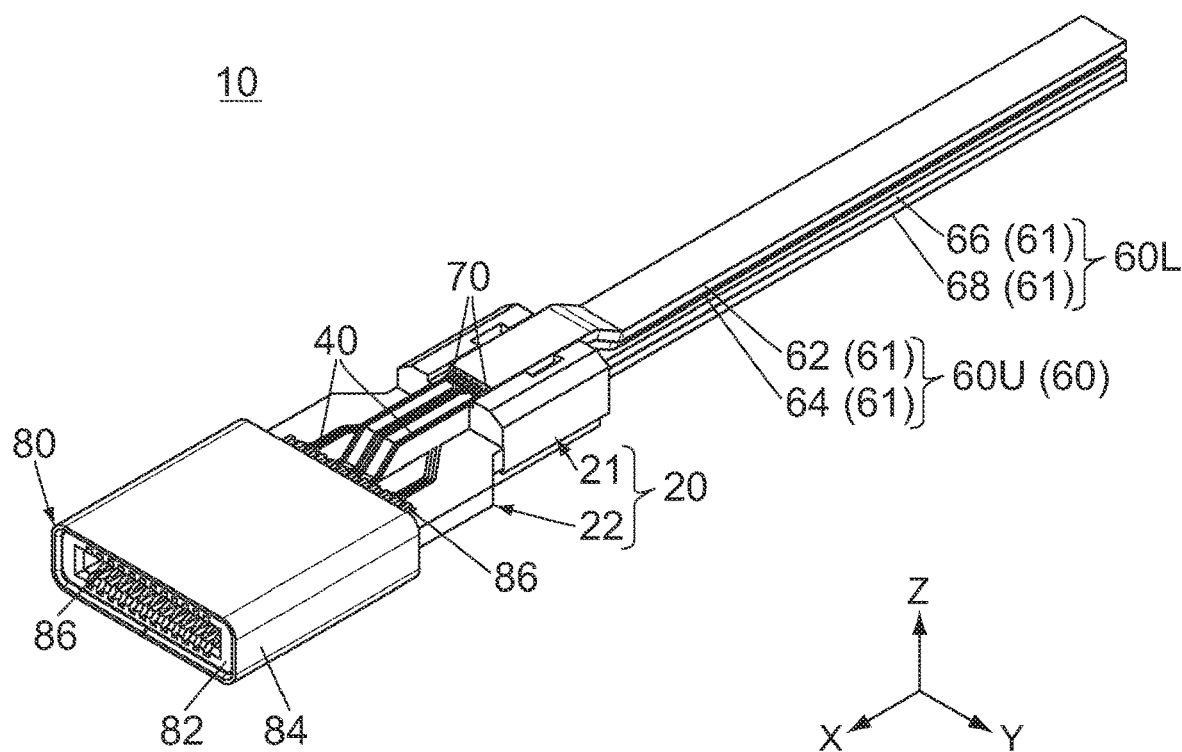
FIG. 1 is a perspective view showing a harness according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 2:
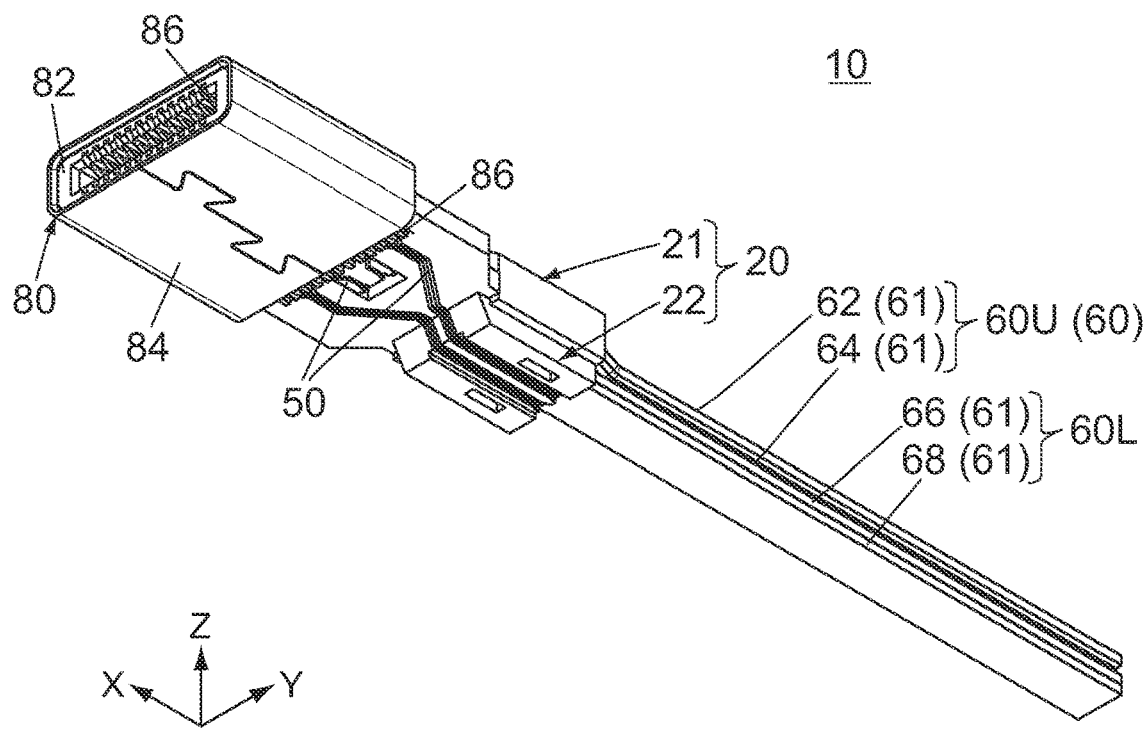
FIG. 2 is another perspective view showing the harness of FIG. 1.
Figure 3:
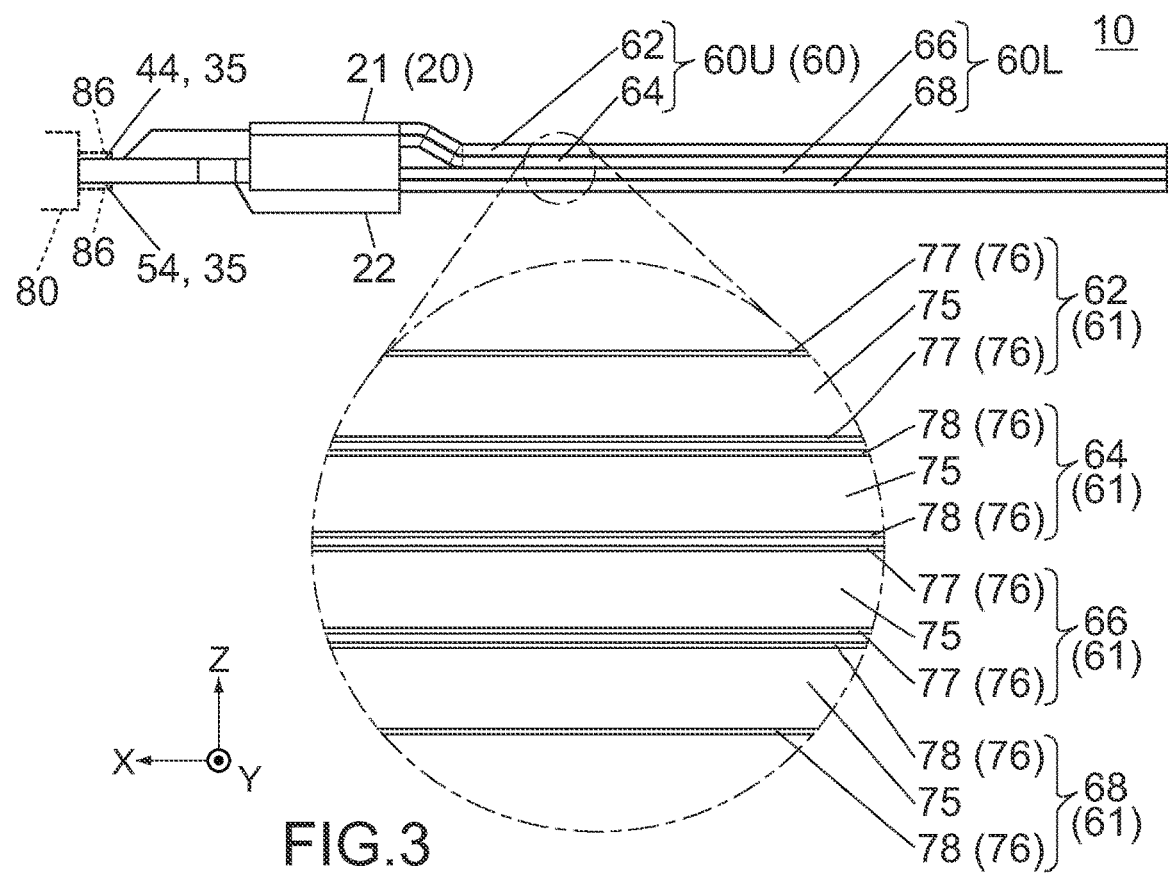
FIG. 3 is a side view showing the harness of FIG. 1, wherein an outline of a part of a connector is illustrated with dashed line, and a part of a cable structure enclosed by chain dotted lines is enlarged and illustrated.

As shown in FIGS. 1 to 3, a harness 10 according to an embodiment of the present invention comprises a connection structure 20. The connection structure 20 is formed of an upper connection body (connection body) 21 and a lower connection body (connection body) 22. Thus, the harness 10 comprises the two connection bodies 21 and 22. Each of the connection bodies 21 and 22 is a so-called paddle card. The harness 10 comprises a connector (object) 80 and a cable structure 60 in addition to the two connection bodies 21 and 22.

The connector 80 and the cable structure 60 are electrically connected with each other via the connection structure 20. The cable structure 60 is connected to an electronic device (not shown) when the harness 10 is used. The connector 80 is connected to a mating connector (not shown) of a mating electronic device (not shown) when the harness 10 is used. Thus, the harness 10 of the present embodiment can electrically connect the electronic device and the mating electronic device with each other.

The object 80 connected to the connection structure 20 is not limited to the connector 80. For example, the connection structure 20 connected to the cable structure 60 may be directly connected to a mating connector (not shown) without the connector 80. In this instance, the mating connector may be a so-called edge connector which is configured to be connected to a circuit board (not shown). Instead, the connection structure 20 may have a front end formed similarly to an edge connector and may be directly connected to a circuit board.

The harness 10 of the present embodiment comprises only the connection structure 20, the cable structure 60 and the connector 80. However, the present invention is not limited thereto. For example, the harness 10 may further comprise a sheath (not shown) which protects the cable structure 60. The sheath may be formed of insulator having elasticity and may cover and protect the most part of the cable structure 60.

Hereafter, explanation will be made about each of the members of the harness 10 of the present embodiment.

The connector 80 of the present embodiment comprises a housing 82 made of insulator, a shell 84 made of conductor such as metal and a plurality of terminals 86 each made of conductor such as metal. The terminals 86 are held by the housing 82. The shell 84 covers the housing 82 and electromagnetically shields the terminals 86. The terminals 86 are divided into two rows in an upper-lower direction. The terminals 86 of each row are arranged in a lateral direction perpendicular to the upper-lower direction. Each of the terminals 86 extends along a front-rear direction perpendicular to both the upper-lower direction and the lateral direction. Each of the terminals 86 has a rear end which projects rearward from the housing 82.

The upper-lower direction of the present embodiment is the Z-direction. In the present embodiment, "upward" means the positive Z-direction, and "downward" means the negative Z-direction. The lateral direction of the present embodiment is the Y-direction. The front-rear direction of the present embodiment is the X-direction. In the present embodiment, "forward" means the positive X-direction, and "rearward" means the negative X-direction.

The connector 80 of the present embodiment has the aforementioned structure. However, the present invention is not limited thereto, but the structure of the connector 80 can be variously modified as necessary.

The cable structure 60 of the present embodiment includes an upper cable structure 60U and a lower cable structure 60L. The cable structure 60U comprises two flat cables 61 consisting of a first flat cable 62 and a second flat cable 64. Thus, the cable structure 60U includes the first flat cable 62 and the second flat cable 64. The cable structure 60L comprises two flat cables 61 consisting of a first flat cable 66 and a second flat cable 68. Thus, the cable structure 60L includes the first flat cable 66 and the second flat cable 68. As described below. the four flat cables 61 of the present embodiment have structures similar to each other.

Each of the flat cables 61 has a rectangular shape in a vertical plane (YZ-plane), the rectangular shape being long in the lateral direction and thin in the upper-lower direction. Each of the flat cables 61 comprises a plurality of core wires 70 each made of conductor and a holding portion 75 made of insulator. For each of the flat cables 61, the core wires 70 are embedded in the holding portion 75. The core wires 70 of each of the flat cables 61 are arranged in the lateral direction and are apart from each other in the lateral direction. Each of the core wires 70 is covered by the holding portion 75 in the YZ-plane and extends along the front-rear direction. Each of the core wires 70 has a front end which is exposed from the holding portion 75.

Figure 12:
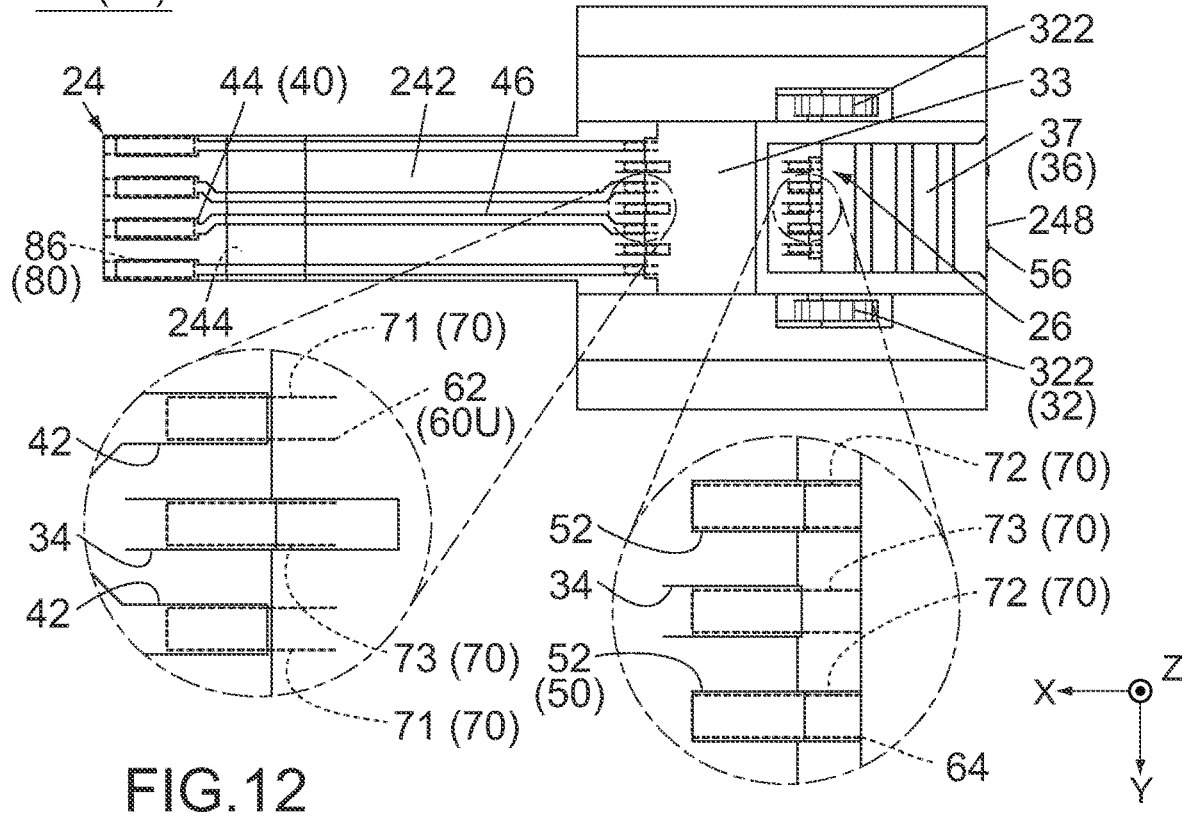
FIG. 12 is a top view showing the upper connection body of FIG. 9, wherein outlines of terminals of the connector and outlines of core wires of the cable structure are illustrated with dashed line, and two parts of the upper connection body each enclosed by chain dotted lines are enlarged and illustrated.

Referring to FIG. 3 together with FIG. 12, the first flat cable 62 of the present embodiment includes two ground conductors 76 (first ground conductors 77) each formed of a thin metal sheet such as copper foil. The core wires 70 of the first flat cable 62 include one or more first core wires 71 and one or more constant-potential wires 73. Thus, the first flat cable 62 includes the first core wires 71, the constant-potential wires 73, the holding portion 75 and the first ground conductors 77. Each of the first core wires 71 of the first flat cable 62 works as a signal wire for transmitting low-frequent signals. Each of the constant-potential wires 73 is kept at a constant voltage such as a ground voltage. The first core wires 71 and the constant-potential wires 73 are alternately arranged in the lateral direction.

The second flat cable 64 of the present embodiment includes two ground conductors 76 (second ground conductors 78) similar to those of the first flat cable 62. The core wires 70 of the second flat cable 64 include one or more second core wires 72 and include one or more constant-potential wires 73 similar to those of the first flat cable 62. Thus, the second flat cable 64 includes the second core wires 72, the constant-potential wires 73, the holding portion 75 and the second ground conductors 78. Each of the second core wires 72 of the second flat cable 64 works as a signal wire for transmitting low-frequent signals. The second core wires 72 and the constant-potential wires 73 are alternately arranged in the lateral direction.

Figure 14:
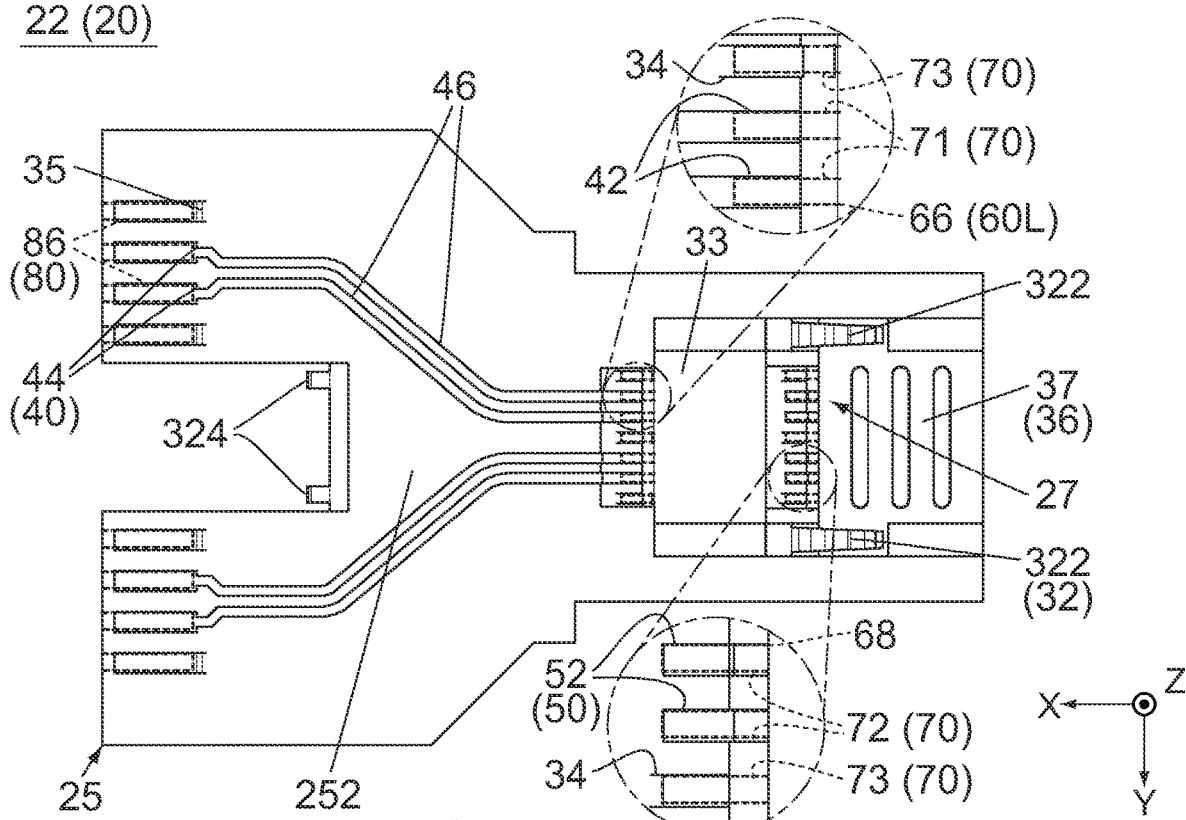
FIG. 14 is a top view showing the lower connection body of FIG. 9, wherein outlines of the terminals of the connector and outlines of the core wires of the cable structure are illustrated with dashed line, and two parts of the lower connection body each enclosed by chain dotted lines are enlarged and illustrated.

Referring to FIG. 3 together with FIG. 14, the first flat cable 66 of the present embodiment includes two first ground conductors 77 similar to those of the first flat cable 62. The core wires 70 of the first flat cable 66 include one or more first core wires 71 similar to those of the first flat cable 62 and one or more constant-potential wires 73 similar to those of the first flat cable 62. Thus, the first flat cable 66 includes the first core wires 71, the constant-potential wires 73, the holding portion 75 and the two first ground conductors 77. Each of the first core wires 71 of the first flat cable 66 works as a signal wire for transmitting high-frequent signals. The first core wires 71 and the constant-potential wires 73 are arranged so that adjacent two of the first core wires 71 are located between two of the constant-potential wires 73 in the lateral direction.

The second flat cable 68 of the present embodiment includes two second ground conductors 78 similar to those of the second flat cable 64. The core wires 70 of the second flat cable 68 include one or more second core wires 72 similar to those of the second flat cable 64 and one or more constant-potential wires 73 similar to those of the second flat cable 64. Thus, the second flat cable 68 includes the second core wires 72, the constant-potential wires 73, the holding portion 75 and the second ground conductors 78. Each of the second core wires 72 of the second flat cable 68 works as a signal wire for transmitting high-frequency signals. The second core wires 72 and the constant-potential wires 73 are arranged so that adjacent two of the second core wires 72 are located between two of the constant-potential wires 73 in the lateral direction.

Referring to FIGS. 1 to 3, each of the flat cables 61 of the present embodiment has the aforementioned structure. For each of the flat cables 61, the two ground conductors 76 cover upper and lower surfaces of the holding portion 75, respectively, and electro-magnetically shield the core wires 70. However, the present invention is not limited thereto. For example, the ground conductors 76 may be provided as necessary. The number and the arrangement of the core wires 70 of each of the flat cables 61 can be modified as necessary. For example, the core wires 70 of each of the flat cables 61 may include only the first core wires 71 (FIG. 12) or only the second core wires 72 (FIG. 12).

Referring to FIGS. 4 to 10, the connection bodies 21 and 22 of the connection structure 20 of the present embodiment have basic structures similar to each other as described below.

The connection body 21 comprises a body 24 made of insulator, one or more first paths 40 each made of conductor, one or more second paths 50 each made of conductor, one first ground plate 32 made of metal and one second ground plate 36 made of metal. Each of the first paths 40 and the second paths 50 is a conductive pattern formed on a surface of the body 24. The first ground plate 32 and the second ground plate 36 are held by the body 24. As described later, the second ground plate 36 is connected to the first ground plate 32.

The connection body 22 comprises a body 25 made of insulator, one or more first paths 40 each made of conductor, one or more second paths 50 each made of conductor, two first ground plates 32 each made of metal and one second ground plate 36 made of metal. Each of the first paths 40 and the second paths 50 is a conductive pattern formed on a surface of the body 25. The first ground plates 32 and the second ground plate 36 are held by the body 25. As described later, the second ground plate 36 is connected to one of the first ground plates 32.

Each of the connection bodies 21 and 22 of the present embodiment has the aforementioned basic structure. However, the present invention is not limited thereto. For example, the basic structures of the connection bodies 21 and 22 may be different from each other. For each of the connection bodies 21 and 22, the first ground plate 32 and the second ground plate 36 may be provided as necessary. Each of the connection bodies 21 and 22 may further comprise another member in addition to the aforementioned members.

Referring to FIGS. 4, 5, 9 and 10, the connection body 21 has a received portion 28. The received portion 28 is a part of a front end of the connection body 21 and projects forward from the other part of the connection body 21. The connection body 22 is formed with a receiving portion 29. The receiving portion 29 is a space formed in the connection body 22 and is recessed rearward from a front end of the connection body 22. The receiving portion 29 is located at the middle of the connection body 22 in the lateral direction. The connection body 21 is combined with the connection body 22 from above so that the received portion 28 is received in the receiving portion 29. The two connection bodies 21 and 22 are combined with each other as described above. The connection structure 20 is an assembly of the thus-combined two connection bodies 21 and 22.

Figure 4:
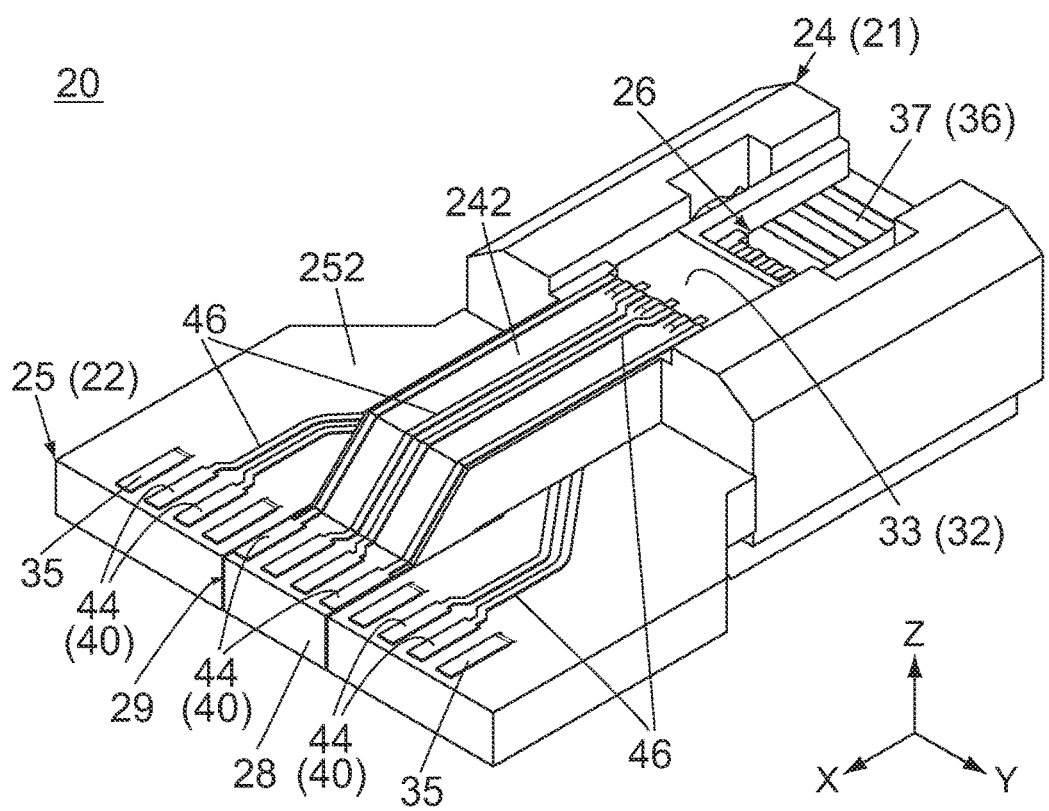
FIG. 4 is a perspective view showing a connection structure of the harness of FIG. 1.
Figure 5:
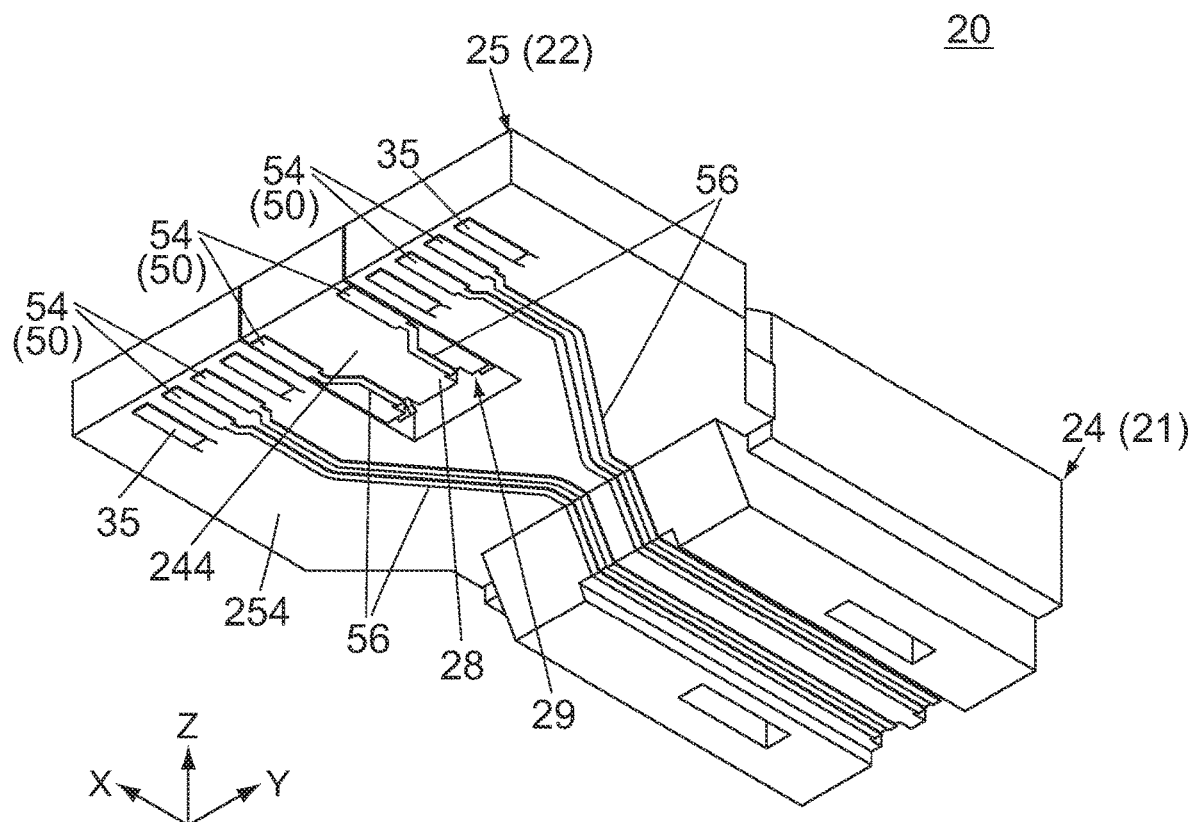
FIG. 5 is another perspective view showing the connection structure of FIG. 4.
Figure 6:
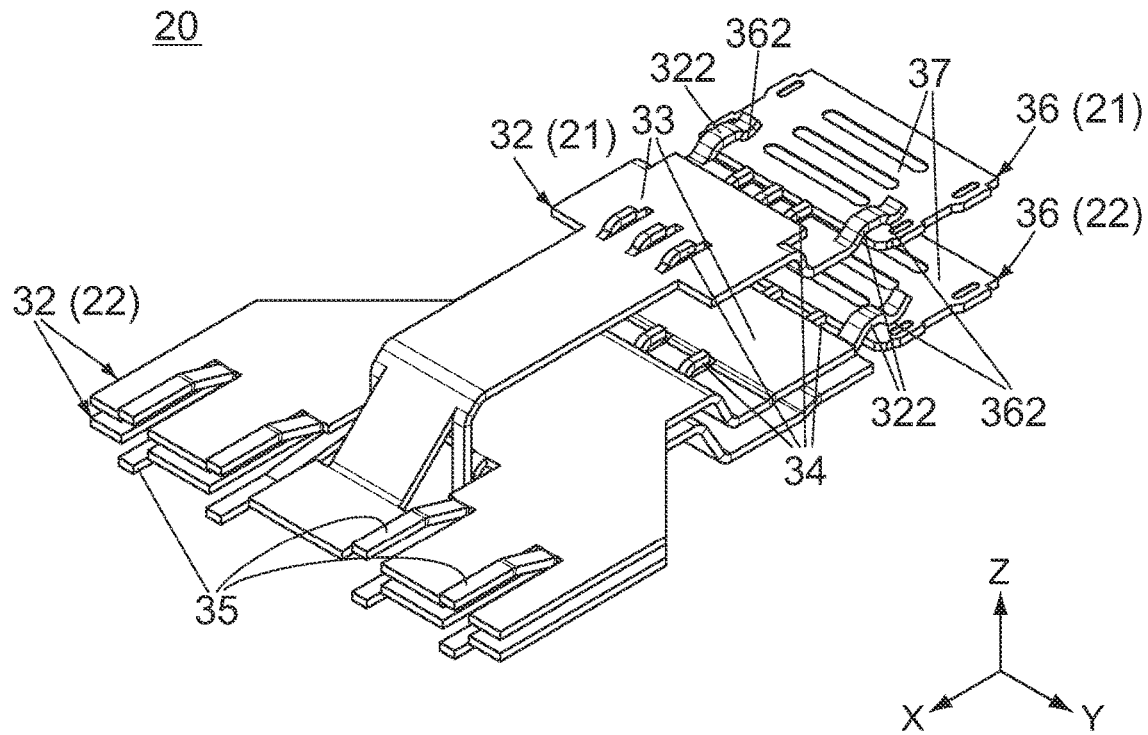
FIG. 6 is a perspective view showing ground plates of the connection structure of FIG. 4.

Referring to FIGS. 4 and 5, when the received portion 28 of the connection body 21 is received in the receiving portion 29 of the connection body 22, the received portion 28 and a front end portion of the connection body 22 form a front end portion of the connection structure 20 which has a flat-plate shape in parallel to a horizontal plane (XY-plane). Thus, the connection structure 20 has the front end portion of a flat-plate shape. Each of the first paths 40 extends rearward from an upper surface of the front end portion of the connection structure 20. Each of the second paths 50 extends rearward from a lower surface of the front end portion of the connection structure 20. Referring to FIGS. 4 to 6, each of the first ground plates 32 of the connection body 22 has exposed portions each of which is located at the front end portion of the connection structure 20 and is exposed from the upper or lower surface of the connection structure 20.

Hereafter, explanation will be made about a summarized structure of the harness 10 of the present embodiment with reference to FIGS. 1 to 3.

The connector 80 is connected to the front end of the connection body 21 and is connected to the front end of the connection body 22. Thus, the connector 80 is connected to the front ends of the two connection bodies 21 and 22. In other words, the connector 80 is connected to the front end portion of the connection structure 20. In detail, the upper terminals 86 of the connector 80 are connected to the first paths 40 and the exposed portions of the first ground plate 32 arranged on the upper surface of the connection structure 20. The lower terminals 86 of the connector 80 are connected to the second paths 50 and the exposed portions of the first ground plate 32 arranged on the lower surface of the connection structure 20.

As previously described, the cable structure 60 includes the upper cable structure 60U and the lower cable structure 60L. The upper cable structure 60U comprises the two flat cables 61 consisting of the first flat cable 62 and the second flat cable 64. The lower cable structure 60L comprises the two flat cables 61 consisting of the first flat cable 66 and the second flat cable 68. In other words, the cable structure 60 includes two sets each consisting of the first flat cable 62 or 66 and the second flat cable 64 or 68.

The first flat cable 62 and the second flat cable 64 of one of the aforementioned two sets are connected to a rear end of one of the two connection bodies 21 and 22, or the connection body 21. The first flat cable 66 and the second flat cable 68 of a remaining one of the aforementioned two sets are connected to a rear end of a remaining one of the two connection bodies 21 and 22, or the connection body 22. As more specifically described later, the core wires 70 of the first flat cable 62 and the second flat cable 64 are connected to the first paths 40, the second paths 50 and the first ground plate 32 (see FIG. 6) of the connection body 21. The core wires 70 of the first flat cable 66 and the second flat cable 68 are connected to the first paths 40, the second paths 50 and the first ground plate 32 of the connection body 22.

The cable structure 60 of the present embodiment comprises an assembly formed of the four flat cables 61 separable from each other. In an instance where the harness 10 comprises a sheath (not shown), the four flat cables 61 are accommodated in and protected by the sheath. According to the present embodiment, a single imaginary flat cable (not shown) which is wide in the lateral direction is divided into the four narrow flat cables 61 which are vertically stacked. By combining the four flat cables 61 into the cable structure 60, the cable structure 60 can be reduced in size in the lateral direction. The present embodiment is preferable in a situation where the size of the cable structure 60 in the upper-lower direction is not specifically restricted while the size of the cable structure 60 in the lateral direction is required to be small.

However, the present invention is not limited to the present embodiment. For example, the cable structure 60 may be an assembly formed of five or more of the flat cables 61. Instead, when the size of the cable structure 60 in the lateral direction is allowed to be large, the cable structure 60 may be a single wide flat cable (not shown). Moreover, the cable structure 60 may include a plurality of coaxial cables (not shown) arranged in the lateral direction instead of each the flat cables 61.

The connection structure 20 of the present embodiment comprises the two connection bodies 21 and 22 formed separately from each other. The connection body 21 is configured to transmit low-frequent signals. The connection body 22 is configured to transmit high-frequent signals. However, the present invention is not limited thereto. For example, when a member for transmitting low-frequent signals and another member for transmitting high-frequent signals do not need to be separated, the connection structure 20 may be a single connection body (not shown). Instead, the connection structure 20 may comprise three or more connection bodies (not shown) vertically combined with each other.

Each of the connection bodies 21 and 22 of the present embodiment is connected to the two flat cables 61. However, the present invention is not limited thereto. For example, each of the connection bodies 21 and 22 may be connected to one of the flat cables 61. Instead, each of the connection bodies 21 and 22 may be connected to three or more of the flat cables 61.

Each of the two connection bodies 21 and 22 of the present embodiment is connected to the connector 80 which is common thereto. However, the present invention is not limited thereto. For example, the two connection bodies 21 and 22 may be connected two connectors (not shown), respectively. Thus, the two connection bodies 21 and 22 may be used to form two harnesses (not shown) separated from each other. In this instance, the connection body 22 does not need to be formed with the receiving portion 29 (see FIG. 9).

One of the two harnesses (not shown) formed as described above comprises a connector (not shown) and the cable structure 60U in addition to the connection body 21. The connector is connected to the front end of the connection body 21. The cable structure 60U is connected to the rear end of the connection body 21. A remaining one of the two harnesses comprises another connector (not shown) and the cable structure 60L in addition to the connection body 22. The connector is connected to the front end of the connection body 22. The cable structure 60L is connected to the rear end of the connection body 22.

Hereafter, more specific explanation will be made about the connection body 21 of the present embodiment.

Referring to FIG. 12 together with FIG. 1, the connection body 21 is configured to be connected to a front end of the cable structure 60U in the front-rear direction, the cable structure 60U comprising one or more of the first core wires 71 and one or more of the second core wires 72.

Figure 9:
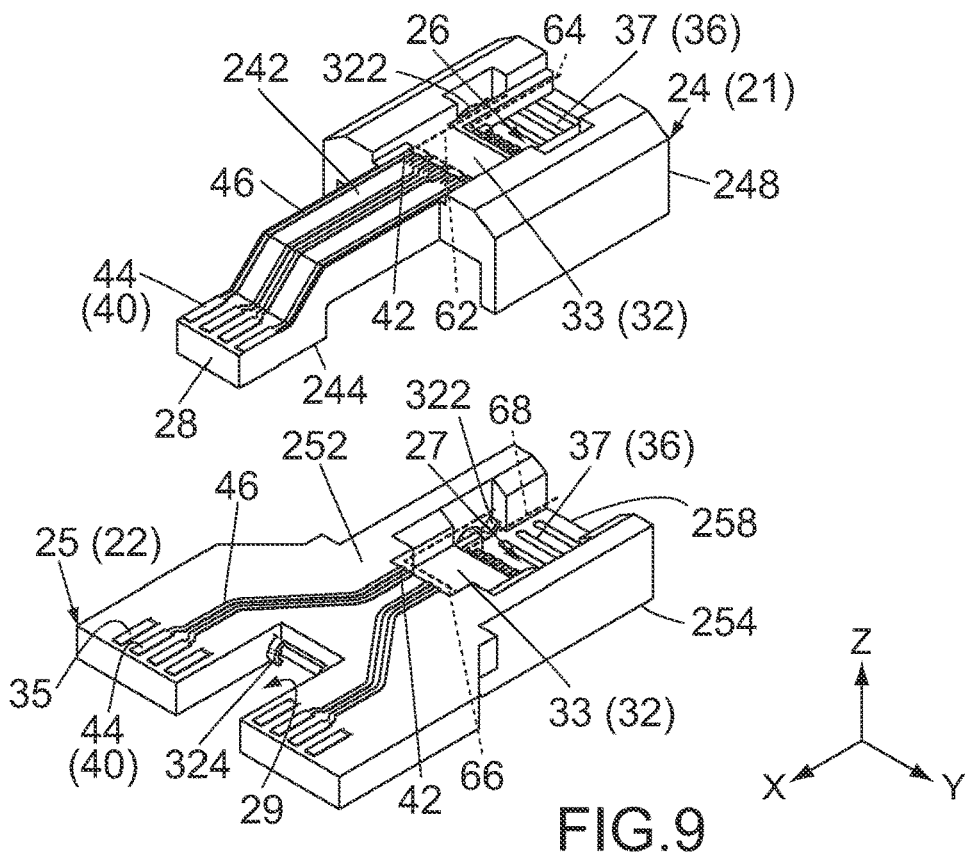
FIG. 9 is a perspective view showing an upper connection body and a lower connection body of the connection structure of FIG. 4, wherein outlines of front ends of first and second flat cables are illustrated with dashed line.
Figure 10:
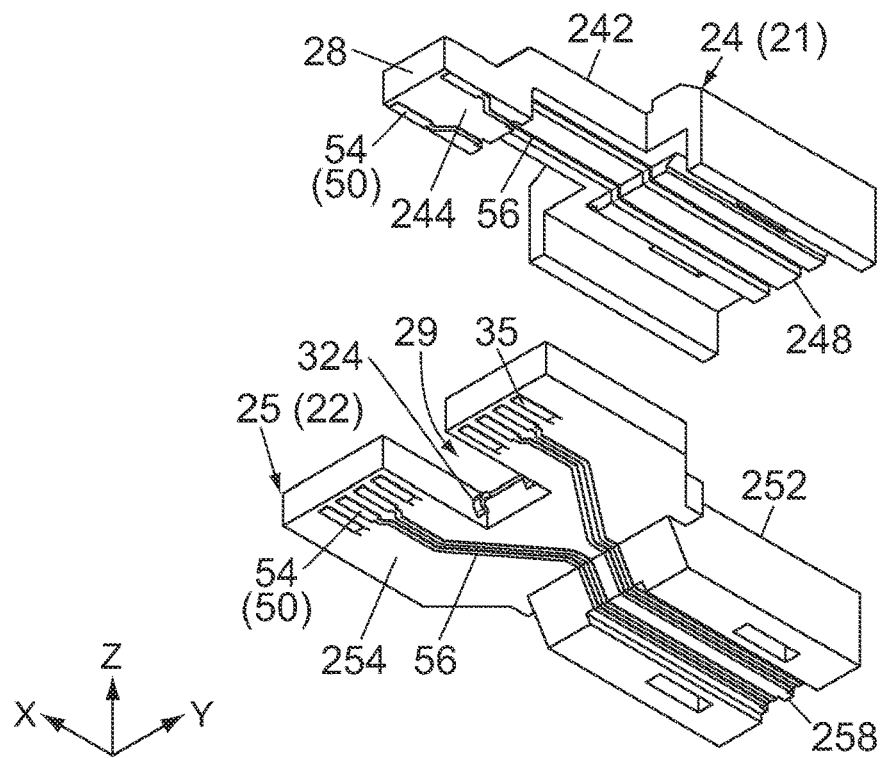
FIG. 10 is another perspective view showing the upper connection body and the lower connection body of FIG. 9.
Figure 11:
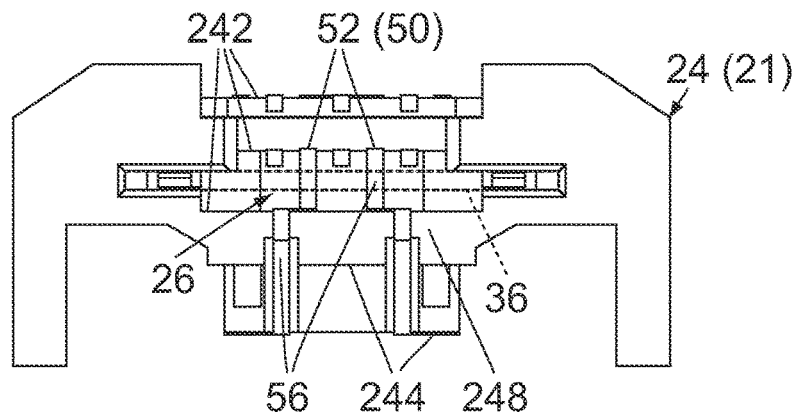
FIG. 11 is a rear view showing the upper connection body and the lower connection body of FIG. 9, wherein outlines of second ground plates are illustrated with dashed line.
Figure 11:
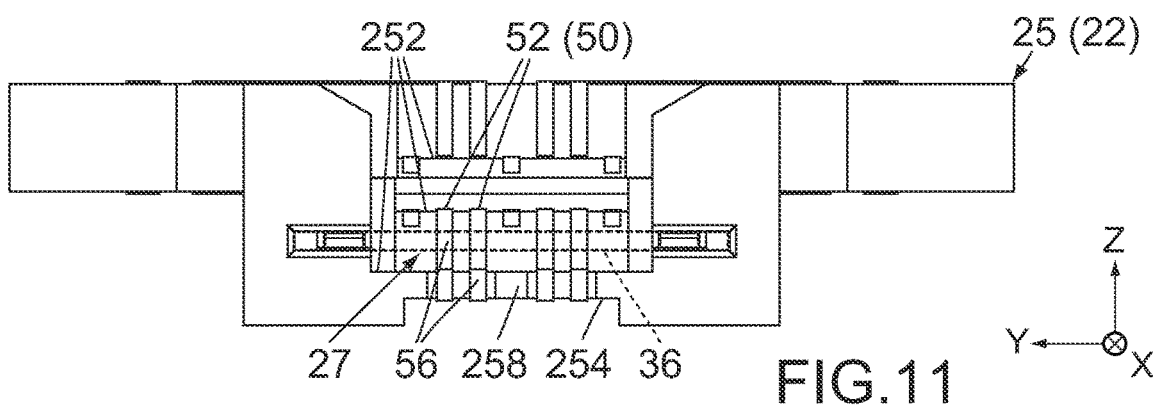

Referring to FIGS. 9 to 11, the body 24 of the connection body 21 has an upper surface 242, a lower surface 244 and a rear surface 248. The upper surface 242 is an upper surface of the connection body 21. The lower surface 244 is a lower surface of the connection body 21. Thus, the upper surface 242 and the lower surface 244 are located at opposites sides of the body 24 in the upper-lower direction, respectively. The rear surface 248 faces rearward and couples the upper surface 242 and the lower surface 244 to each other in the upper-lower direction.

The body 24 of the present embodiment has upper and lower sides each of which is formed with one or more steps. Moreover, the body 24 is formed with a recessed portion 26 which is recessed downward. The recessed portion 26 is located on the rearmost step of the upper side of the body 24. Referring to FIG. 9 together with FIG. 3, the second flat cable 64 has a front end portion configured to be accommodated in the recessed portion 26. The first flat cable 62 has a front end portion configured to be accommodated in a space which is formed above a step located forward of the recessed portion 26. The thus-formed steps including the recessed portion 26 enable each of the first flat cable 62 and the second flat cable 64 to be easily connected to the connection body 21 from above while the first flat cable 62 and the second flat cable 64 are vertically arranged and extend along the front-rear direction.

The present invention is not limited to the present embodiment, but the steps including the recessed portion 26 may be formed as necessary. For example, when another recessed portion which is further recessed downward is formed rearward of the recessed portion 26, three of the flat cables 61 can be easily connected to the connection body 21. However, in an instance where three or more of the flat cables 61 are connected to the one connection body 21, the connection body 21 tends to have a complicated structure. Therefore, when the number of the flat cables 61 of the cable structure 60 needs to be increased, it is generally preferable that the number of the connection bodies of the connection structure 20 is increased.

Referring to FIGS. 9 and 10, since the upper side of the body 24 is formed with the steps, positions of parts of the upper surface 242 in the upper-lower direction are different from each other depending on positions of these parts in the front-rear direction. Since the lower side of the body 24 is formed with the steps, positions of parts of the lower surface 244 in the upper-lower direction are different from each other depending on positions of these parts in the front-rear direction. Each of the upper surface 242 and the lower surface 244 of the present embodiment has the aforementioned structure. However, the present invention is not limited thereto. For example, each of the upper surface 242 and the lower surface 244 may be a single flat surface extending in parallel to the XY-plane.

Referring to FIGS. 9 to 11, the rear surface 248 of the present embodiment is located at a rear end of the body 24 and extends in parallel to the YZ-plane. However, the present invention is not limited thereto. The structure of the rear surface 248 is not specifically limited, provided that the upper surface 242 and the lower surface 244 are seamlessly connected to each other via the rear surface 248. For example, the body 24 may be formed with a recess which is recessed forward from the rear end thereof. The rear surface 248 may be a front end surface of this recess.

Referring to FIG. 12, each of the first paths 40 has a first wired portion 42, a first terminal portion 44 and a first coupling portion 46. The first wired portions 42, the first terminal portions 44 and the first coupling portions 46 are formed on the upper surface 242 of the body 24. Thus, all the first paths 40 of the connection body 21 are located on the upper surface 242 of the body 24. The first wired portions 42 are located at the middle of the upper surface 242 in the front-rear direction and are arranged in the lateral direction. The first terminal portions 44 are located at a front end of the upper surface 242 and are arranged in the lateral direction. Thus, each of the first terminal portions 44 is located forward of the first wired portion 42. Each of the first coupling portions 46 extends between the first wired portion 42 and the first terminal portion 44 along the upper surface 242. Thus, each of the first coupling portions 46 couples the first wired portion 42 and the first terminal portion 44 to each other.

The first wired portions 42 are fixed and connected to the first core wires 71 of the cable structure 60U, respectively, via soldering, etc. under a connected state where the connection body 21 is connected to the cable structure 60U. Each of the first terminal portions 44 is fixed and connected to the upper terminal 86 of the connector 80 via soldering, etc. when the connection body 21 is connected to the connector 80.

Figure 13:
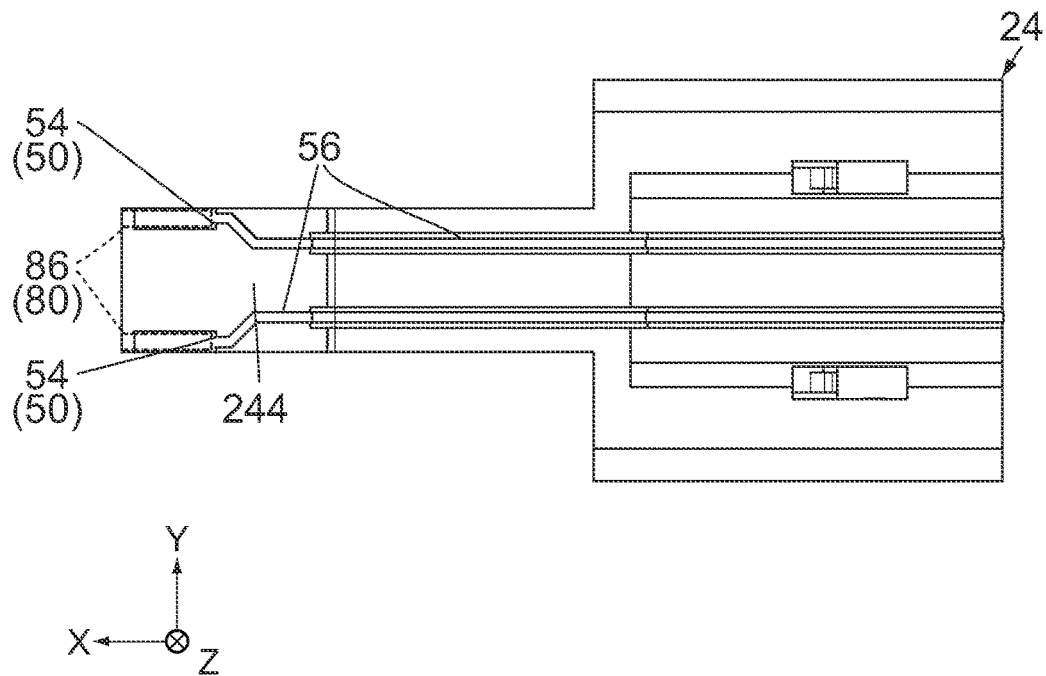
FIG. 13 is a bottom view showing the upper connection body of FIG. 12, wherein outlines of the terminals of the connector are illustrated with dashed line.

Referring to FIGS. 11 to 13, each of the second paths 50 has a second wired portion 52, a second terminal portion 54 and a second coupling portion 56. All the second paths 50 of the connection body 21 are located partially on the upper surface 242 of the body 24, partially on the rear surface 248 and partially on the lower surface 244.

In detail, the second wired portions 52 are formed on the upper surface 242 of the body 24. The second terminal portions 54 are formed on the lower surface 244 of the body 24. The second wired portions 52 are located forward of the recessed portion 26 and are arranged in the lateral direction. The second terminal portions 54 are located on a front end of the lower surface 244 and are arranged in the lateral direction. Each of the second terminal portions 54 is located forward of the second wired portion 52. Each of the second coupling portions 56 extends between the second wired portion 52 and the second terminal portion 54 along the upper surface 242, the rear surface 248 and the lower surface 244. Thus, each of the second coupling portions 56 extends on the upper surface 242, the rear surface 248 and the lower surface 244 of the body 24 and couples the second terminal portion 54 and the second wired portion 52 to each other.

The second wired portions 52 are fixed and connected to the second core wires 72 of the cable structure 60U, respectively, via soldering, etc. under the connected state. Each of the second terminal portions 54 is fixed and connected to the lower terminal 86 of the connector 80 via soldering, etc. when the connection body 21 is connected to the connector 80.

According to the present embodiment, the first terminal portions 44 of the connection body 21 are provided on the upper surface 242 of the connection body 21, while the second terminal portions 54 of the connection body 21 are provided on the lower surface 244 of the connection body 21. The first terminal portions 44 and the second terminal portions 54 are connectable to the object 80 such as the connector 80. Thus, both of the upper surface 242 and the lower surface 244 of the connection body 21 of the present embodiment are connectable to the object 80.

In contrast, all the first wired portions 42 and all the second wired portions 52 of the connection body 21 are provided on the upper surface 242 of the connection body 21. As described later, parts of the connection body 21, which are configured to be connected to the constant-potential wires 73 of the cable structure 60U, are also provided on the upper surface 242 of the connection body 21. According to this arrangement, when the first core wires 71, the second core wires 72 and the constant-potential wires 73 of the cable structure 60U are connected to the first wired portions 42, the second wired portions 52, etc., a cable fixing process such as soldering will be performed only for the upper surface 242 of the connection body 21. Thus, the present embodiment provides the connection body 21 which has the upper surface 242 and the lower surface 244 both configured to be connected to the object 80 such as the connector 80 and which is easily connectable to the cable structure 60U.

If the existing technique were applied, a part of the second coupling portion 56 located on the upper surface 242 and another part of the second coupling portion 56 located on the lower surface 244 should be coupled via a through-hole. In this existing coupling method, a cross-section of a part of the second coupling portion 56 located on the upper surface 242 or the lower surface 244 would have a shape and a size different from those of a cross-section of another part of the second coupling portion 56 which is passed through the through-hole; this structure would make it difficult to adjust the impedance of the second paths 50; and the through-hole opens at the upper surface 242 and the lower surface 244 and would make it difficult to form the first paths 40 and the second paths 50.

In contrast, the connection body 21 of the present embodiment is not formed with any through-holes at all. Upper and lower parts of each of the second paths 50 of the present embodiment can be vertically coupled to each other not via a through-hole but via a part of the second coupling portion 56 formed on the rear surface 248 of the connection body 21. According to the coupling method of the present embodiment, the impedance of the second paths 50 can be easily adjusted. In addition, since there is no need to form openings of a through-hole on the upper surface 242 and the lower surface 244, flexibility in design of the first paths 40 and the second paths 50 is improved. For example, the first paths 40 and the second paths 50 can be arranged with narrow pitch.

Referring to FIG. 12, the first wired portions 42 of the present embodiment are connected to the first core wires 71 of the first flat cable 62. The second wired portions 52 of the present embodiment are connected to the second core wires 72 of the second flat cable 64. However, the present invention is not limited thereto. For example, each of the first wired portions 42 and the second wired portions 52 may be connected to a core wire of a coaxial cable (not shown).

The first wired portions 42 of the present embodiment are located at positions same as each other in the front-rear direction. The second wired portions 52 of the present embodiment are located at positions same as each other in the front-rear direction. The position of the first wired portions 42 in the front-rear direction is located forward of the position of the second wired portions 52 in the front-rear direction. A step is formed between the first wired portions 42 and the second wired portions 52 in the front-rear direction. As a result, each of the first wired portions 42 of the present embodiment is located forward of the second wired portion 52 and is located above the second wired portion 52. According to this arrangement, the first flat cable 62 can be easily arranged above the second flat cable 64. However, the present invention is not limited thereto. For example, the first wired portions 42 may be located at a position same as another position of the second wired portions 52 in the upper-lower direction.

Figure 7:
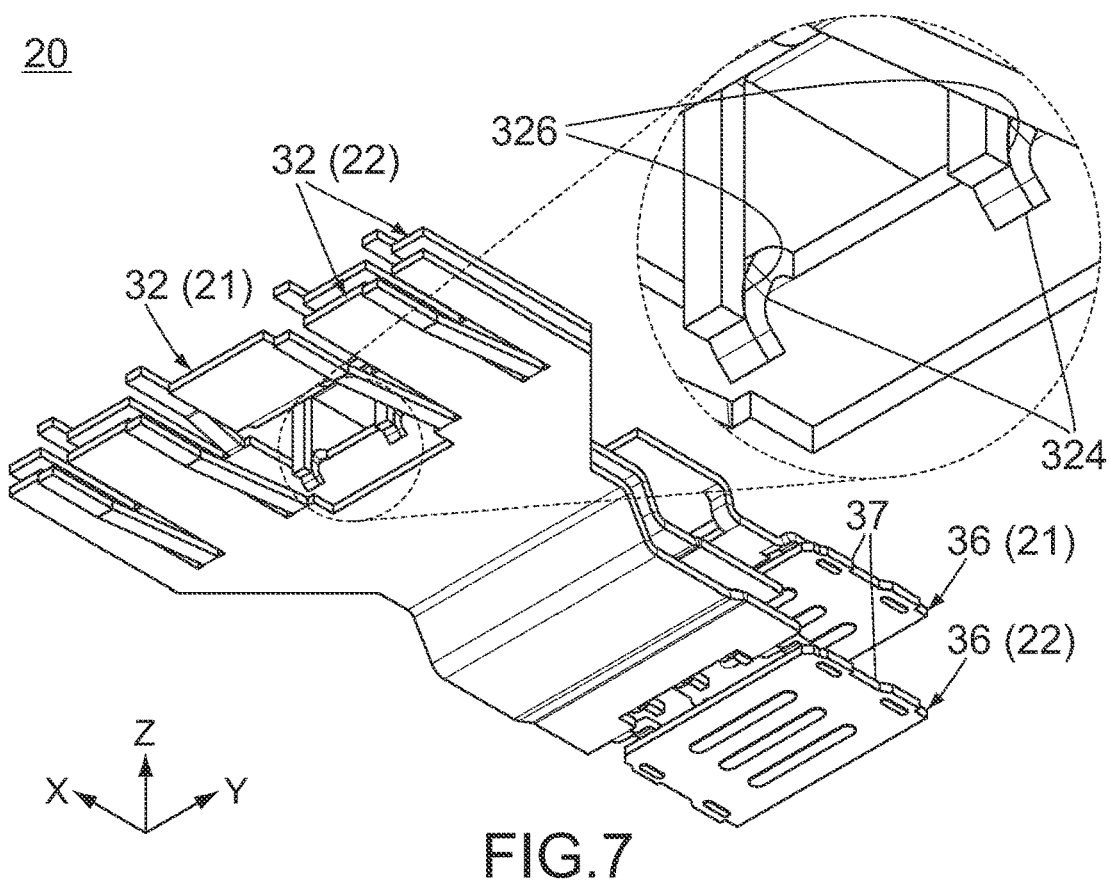
FIG. 7 is another perspective view showing the ground plates of FIG. 6, wherein a part of the ground plate enclosed by dashed line is enlarged and illustrated.
Figure 8:
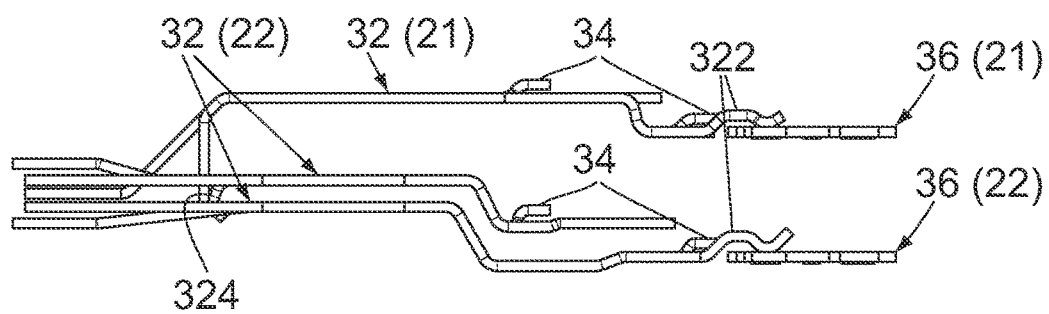
FIG. 8 is a side view showing the ground plates of FIG. 6.

Referring to FIGS. 6 to 8, as previously described, the connection body 21 of the present embodiment comprises the one first ground plate 32 and the one second ground plate 36. Each of the first ground plate 32 and the second ground plate 36 of the connection body 21 has a thin flat-plate shape which is roughly in parallel to the XY-plane. The second ground plate 36 is located rearward of the first ground plate 32.

Referring to FIG. 6 together with FIGS. 9 and 10, the first ground plate 32 is partially embedded in the body 24 so as to be located between the first paths 40 and the second paths 50 in the upper-lower direction. According to the present embodiment, the first ground plate 32 does not need to be formed with a hole which corresponds to a through-hole. Therefore, interference (cross-talk) between the first paths 40 and the second paths 50 can be reliably prevented. Moreover, the second ground plate 36 is attached to the body 24. In detail, the second ground plate 36 of the present embodiment is press-fit into the recessed portion 26 of the body 24 from behind. Referring to FIG. 11, the second ground plate 36 is located above the second coupling portions 56. In detail, the second ground plate 36 is apart from the second coupling portions 56 in the upper-lower direction and partially covers the second coupling portions 56 from above.

Referring to FIG. 6 together with FIG. 9, the second ground plate 36 is connected to the first ground plate 32. In detail, the first ground plate 32 of the connection body 21 is provided with two connection pieces 322. The connection pieces 322 are located at opposite sides of the first ground plate 32 in the lateral direction, respectively, and extend rearward from the first ground plate 32. Each of the connection pieces 322 is resiliently deformable. The second ground plate 36 of the connection body 21 has two connected portions 362. The connected portions 362 are located at opposite sides of an upper surface of the second ground plate 36 in the lateral direction, respectively. The connection pieces 322 are pressed against the connected portions 362, respectively, and thereby the first ground plate 32 has a ground voltage same as that of the second ground plate 36.

The connection body 21 of the present embodiment comprises the first ground plate 32 and the second ground plate 36 which are arranged as described above. However, the present invention is not limited thereto. For example, a necessary number of the first ground plate 32 and the second ground plate 36 may be provided as necessary. For example, in an instance where the connection body 21 is connected to only one of the flat cables 61 (see FIG. 1), the connection body 21 may comprise only the first ground plate 32.

Referring to FIGS. 9 and 12 together with FIG. 6, the connection body 21 of the present embodiment comprises a first ground portion 33 and a second ground portion 37. The first ground portion 33 of the present embodiment is a part of the first ground plate 32. In detail, the first ground portion 33 is a part of an upper surface of a rear end portion of the first ground plate 32 and is exposed upward from the upper surface 242 of the body 24. The second ground portion 37 of the present embodiment is a part of the second ground plate 36. In detail, the second ground portion 37 is a part of an upper surface of the second ground plate 36 and faces upward.

Figure 16:
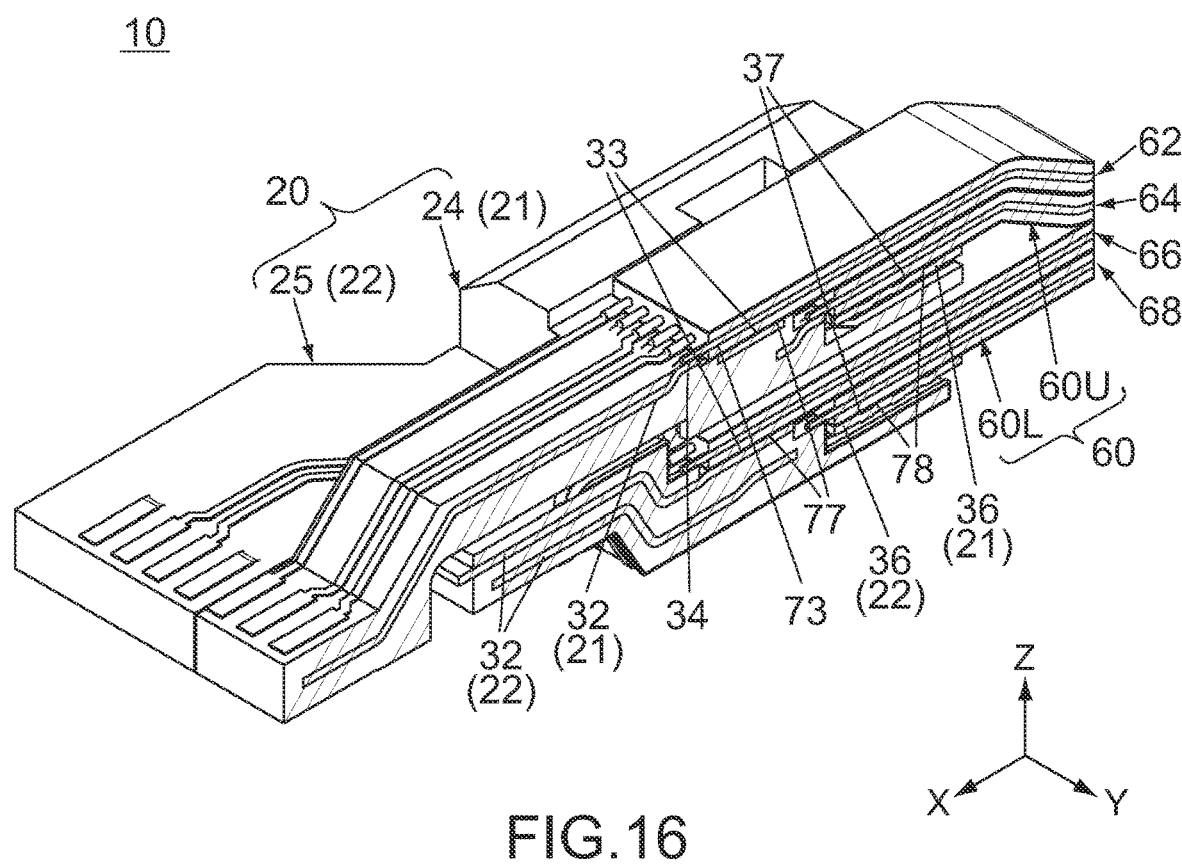
FIG. 16 is a partially cut-away, perspective view showing the harness of FIG. 1, wherein the connector is not illustrated.

Referring to FIG. 12, the first ground portion 33 is located between the first wired portions 42 and the second wired portions 52 in the front-rear direction. The second ground portion 37 is located in the recessed portion 26 and is located rearward of the second wired portions 52. Referring to FIGS. 12 and 16, the first ground portion 33 is connected to the lower first ground conductor 77 of the first flat cable 62 under the connected state, and thereby the first ground plate 32 has a ground voltage same as those of the first ground conductors 77. The second ground portion 37 is connected to the lower second ground conductor 78 of the second flat cable 64 under the connected state, and thereby the second ground plate 36 has a ground voltage same as those of the second ground conductors 78.

Referring to FIG. 16, the first ground portion 33 and the second ground portion 37 of the present embodiment are connected to the first ground conductor 77 of the first flat cable 62 and the second ground conductor 78 of the second flat cable 64, respectively, under the connected state. However, the present invention is not limited thereto. For example, each of the first ground portion 33 and the second ground portion 37 may be connected to shield wires of a plurality of coaxial cables (not shown).

Referring to FIGS. 6 and 8, the first ground plate 32 of the connection body 21 of the present embodiment has a plurality of constant-potential wired portions 34. The constant-potential wired portions 34 are divided into two rows in the front-rear direction. Referring to FIG. 12, each of the constant-potential wired portions 34 is exposed from the upper surface 242 of the body 24. The front constant-potential wired portions 34 are arranged in the lateral direction together with the first wired portions 42. The rear constant-potential wired portions 34 are arranged in the lateral direction together with the second wired portions 52.

The arrangement of the front constant-potential wired portions 34 and the first wired portions 42 in the lateral direction is same as the arrangement of the constant-potential wires 73 and the first core wires 71 of the first flat cable 62. The front constant-potential wired portions 34 are fixed and connected to the constant-potential wires 73 of the first flat cable 62, respectively, via soldering, etc. under the connected state. The arrangement of the rear constant-potential wired portions 34 and the second wired portions 52 in the lateral direction is same as the arrangement of the constant-potential wires 73 and the second core wires 72 of the second flat cable 64. The rear constant-potential wired portions 34 are fixed and connected to the constant-potential wires 73 of the second flat cable 64, respectively, via soldering, etc. under the connected state.

Hereafter, more specific explanation will be made about the connection body 22 of the present embodiment.

Referring to FIG. 14 together with FIG. 1, the connection body 22 is configured to be connected to a front end of the cable structure 60L in the front-rear direction, the cable structure 60L comprising one or more of the first core wires 71 and one or more of the second core wires 72.

Referring to FIGS. 9 to 11, the body 25 of the connection body 22 has an upper surface 252, a lower surface 254 and a rear surface 258. The upper surface 252 is an upper surface of the connection body 22. The lower surface 254 is a lower surface of the connection body 22. Thus, the upper surface 252 and the lower surface 254 are located at opposite sides of the body 25 in the upper-lower direction, respectively. The rear surface 258 faces rearward and couples the upper surface 252 and the lower surface 254 to each other in the upper-lower direction.

The body 25 of the present embodiment has upper and lower sides each of which is formed with one or more steps. Moreover, the body 25 is formed with a recessed portion 27 which is recessed downward. The recessed portion 27 is located on the rearmost step of the upper side of the body 25. Referring to FIG. 9 together with FIG. 3, the second flat cable 68 has a front end portion configured to be accommodated in the recessed portion 27. The first flat cable 66 has a front end portion configured to be accommodated in a space which is formed above a step located forward of the recessed portion 27. The thus-formed steps including the recessed portion 27 enable each of the first flat cable 66 and the second flat cable 68 to be easily connected to the connection body 22 from above while the first flat cable 66 and the second flat cable 68 are vertically arranged and extend along the front-rear direction. However, the present invention is not limited thereto, but the steps including the recessed portion 27 may be formed as necessary.

Referring to FIGS. 9 and 10, since the upper side of the body 25 is formed with the steps, positions of parts of the upper surface 252 in the upper-lower direction are different from each other depending on positions of these parts in the front-rear direction. Since the lower side of the body 25 is formed with the steps, positions of parts of the lower surface 254 in the upper-lower direction are different from each other depending on positions of these parts in the front-rear direction. Each of the upper surface 252 and the lower surface 254 of the present embodiment has the aforementioned structure. However, the present invention is not limited thereto. For example, each of the upper surface 252 and the lower surface 254 may be a single flat surface extending in parallel to the XY-plane.

Referring to FIGS. 9 to 11, the rear surface 258 of the present embodiment is located at a rear end of the body 25 and extends in parallel to the YZ-plane. However, the present invention is not limited thereto. The structure of the rear surface 258 is not specifically limited, provided that the upper surface 252 and the lower surface 254 are seamlessly connected to each other via the rear surface 258. For example, the body 25 may be formed with a recess which is recessed forward from the rear end thereof. The rear surface 258 may be a front end surface of this recess.

Referring to FIG. 14, each of the first paths 40 has a first wired portion 42, a first terminal portion 44 and a first coupling portion 46. The first wired portions 42, the first terminal portions 44 and the first coupling portions 46 are formed on the upper surface 252 of the body 25. Thus, all the first paths 40 of the connection body 22 are located on the upper surface 252 of the body 25. The first wired portions 42 are located at the middle of the upper surface 252 in the front-rear direction and are arranged in the lateral direction. The first terminal portions 44 are located at a front end of the upper surface 252 and are arranged in the lateral direction. Thus, each of the first terminal portions 44 is located forward of the first wired portion 42. Each of the first coupling portions 46 extends between the first wired portion 42 and the first terminal portion 44 along the upper surface 252. Thus, each of the first coupling portions 46 couples the first wired portion 42 and the first terminal portion 44 to each other.

The first wired portions 42 are fixed and connected to the first core wires 71 of the cable structure 60L, respectively, via soldering, etc. under a connected state where the connection body 22 is connected to the cable structure 60L. Each of the first terminal portions 44 is fixed and connected to the upper terminal 86 of the connector 80 via soldering, etc. when the connection body 22 is connected to the connector 80.

Figure 15:
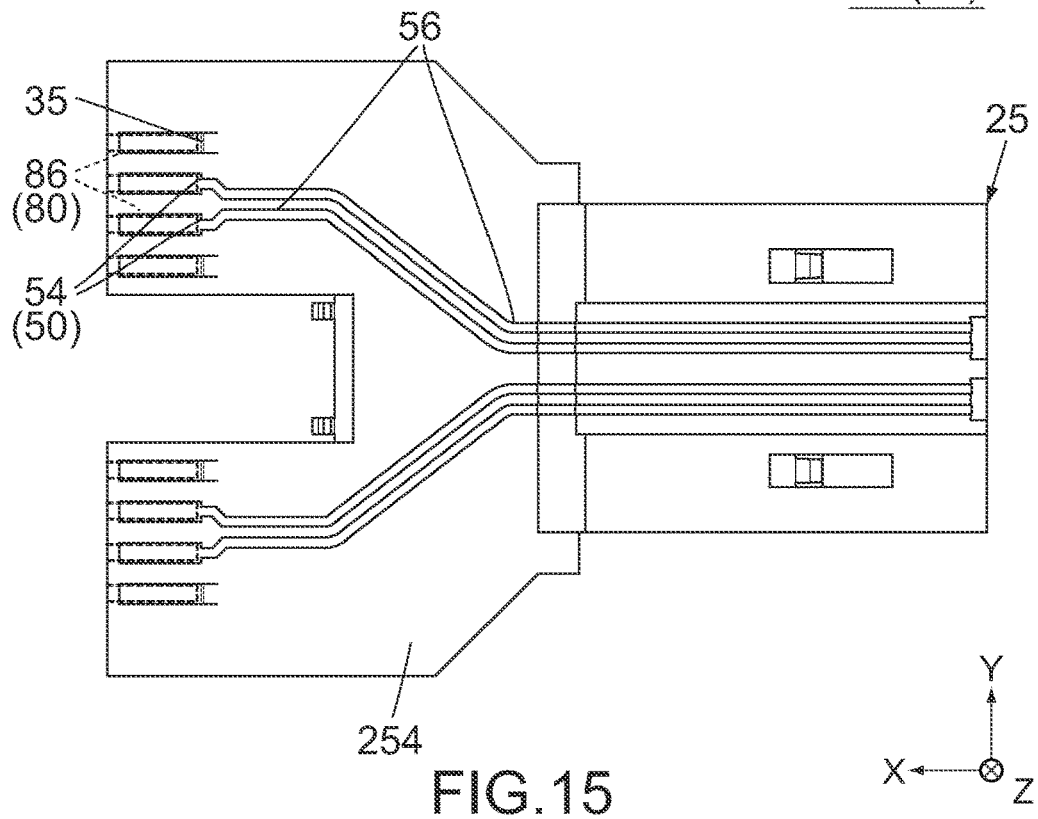
FIG. 15 is a bottom view showing the lower connection body of FIG. 14, wherein outlines of the terminals of the connector are illustrated with dashed line.

Referring to FIGS. 11, 14 and 15, each of the second paths 50 has a second wired portion 52, a second terminal portion 54 and a second coupling portion 56. All the second paths 50 of the connection body 22 are located partially on the upper surface 252 of the body 25, partially on the rear surface 258 and partially on the lower surface 254.

In detail, the second wired portions 52 are formed on the upper surface 252 of the body 25. The second terminal portions 54 are formed on the lower surface 254 of the body 25. The second wired portions 52 are located forward of the recessed portion 27 and are arranged in the lateral direction. The second terminal portions 54 are located at a front end of the lower surface 254 and are arranged in the lateral direction. Each of the second terminal portions 54 is located forward of the second wired portion 52. Each of the second coupling portions 56 extends between the second wired portion 52 and the second terminal portion 54 along the upper surface 252, the rear surface 258 and the lower surface 254. Thus, each of the second coupling portions 56 extends on the upper surface 252, the rear surface 258 and the lower surface 254 of the body 25 and couples the second terminal portion 54 and the second wired portion 52 to each other.

The second wired portions 52 are fixed and connected to the second core wires 72 of the cable structure 60L, respectively, via soldering, etc. under the connected state. Each of the second terminal portions 54 is fixed and connected to the lower terminal 86 of the connector 80 via soldering, etc. when the connection body 22 is connected to the connector 80.

Both of the upper surface 252 and the lower surface 254 of the connection body 22 of the present embodiment are connectable to the object 80 similarly to those of the connection body 21 (see FIGS. 12 and 13). In contrast, all the first wired portions 42 and all the second wired portions 52 of the connection body 22 are provided on the upper surface 252 of the connection body 22 similarly to those of the connection body 21. As described later, parts of the connection body 22, which are configured to be connected to the constant-potential wires 73 of the cable structure 60L, are also provided on the upper surface 252 of the connection body 22. The present embodiment provides the connection body 22 which has the upper surface 252 and the lower surface 254 both configured to be connected to the object 80 such as the connector 80 and which is easily connectable to the cable structure 60L.

The connection body 22 of the present embodiment is not formed with any through-holes at all. Upper and lower parts of each of the second paths 50 of the present embodiment can be vertically coupled to each other not via a through-hole but via a part of the second coupling portion 56 formed on the rear surface 258 of the connection body 22. According to the coupling method of the present embodiment, the impedance of the second paths 50 can be easily adjusted. In addition, since there is no need to form openings of a through-hole on the upper surface 252 and the lower surface 254, flexibility in design of the first paths 40 and the second paths 50 is improved.

Referring to FIG. 14, the first wired portions 42 of the present embodiment are connected to the first core wires 71 of the first flat cable 66. The second wired portions 52 of the present embodiment are connected to the second core wires 72 of the second flat cable 68. However, the present invention is not limited thereto. For example, each of the first wired portions 42 and the second wired portions 52 may be connected to a core wire of a coaxial cable (not shown).

The first wired portions 42 of the present embodiment are located at positions same as each other in the front-rear direction. The second wired portions 52 of the present embodiment are located at positions same as each other in the front-rear direction. The position of the first wired portions 42 in the front-rear direction is located forward of the position of the second wired portions 52 in the front-rear direction. A step is formed between the first wired portions 42 and the second wired portions 52 in the front-rear direction. As a result, each of the first wired portions 42 of the present embodiment is located forward of the second wired portion 52 and is located above the second wired portion 52. According to this arrangement, the first flat cable 66 can be easily arranged above the second flat cable 68. However, the present invention is not limited thereto. For example, the first wired portions 42 may be located at a position same as another position of the second wired portions 52 in the upper-lower direction.

Referring to FIGS. 6 to 8, as previously described, the connection body 22 of the present embodiment comprises the two first ground plate 32 and the one second ground plate 36. Each of the first ground plates 32 and the second ground plate 36 of the connection body 22 has a thin flat-plate shape which is roughly in parallel to the XY-plane. The two first ground plates 32 are apart from each other in the upper-lower direction and extend in parallel to each other. The second ground plate 36 is located rearward of the two first ground plates 32.

Referring to FIG. 6 together with FIGS. 9 and 10, each of the first ground plates 32 is partially embedded in the body 25 so as to be located between the first paths 40 and the second paths 50 in the upper-lower direction. The second ground plate 36 is attached to the body 25. In detail, the second ground plate 36 of the present embodiment is press-fit into the recessed portion 27 of the body 25 from behind. Referring to FIG. 11, the second ground plate 36 is located above the second coupling portions 56. In detail, the second ground plate 36 is apart from the second coupling portions 56 in the upper-lower direction and partially covers the second coupling portions 56 from above.

Referring to FIG. 6 together with FIG. 9, the second ground plate 36 is connected to the first ground plate 32. In detail, the lower first ground plate 32 of the connection body 22 is provided with two connection pieces 322. The connection pieces 322 are located at opposite sides of the lower first ground plate 32 in the lateral direction, respectively, and extend rearward from the lower first ground plate 32. Each of the connection pieces 322 is resiliently deformable. The second ground plate 36 of the connection body 22 has two connected portions 362. The connected portions 362 are located at opposite sides of the upper surface of the second ground plate 36 in the lateral direction, respectively. The connection pieces 322 are pressed against the connected portions 362, respectively, and thereby the lower first ground plate 32 has a ground voltage same as that of the second ground plate 36.

The connection body 22 of the present embodiment comprises the first ground plates 32 and the second ground plate 36 which are arranged as described above. However, the present invention is not limited thereto. For example, a necessary number of the first ground plates 32 and the second ground plate 36 may be provided as necessary. For example, the connection body 22 may comprise only the lower first ground plate 32 and the second ground plate 36.

Referring to FIGS. 9 and 14 together with FIG. 6, the connection body 22 of the present embodiment comprises a first ground portion 33 and a second ground portion 37. The first ground portion 33 of the present embodiment is a part of the upper first ground plate 32. In detail, the first ground portion 33 is a part of an upper surface of a rear end portion of the upper first ground plate 32 and is exposed upward from the upper surface 252 of the body 25. The second ground portion 37 of the present embodiment is a part of the second ground plate 36. In detail, the second ground portion 37 is a part of an upper surface of the second ground plate 36 and faces upward.

Referring to FIG. 14, the first ground portion 33 is located between the first wired portions 42 and the second wired portions 52 in the front-rear direction. The second ground portion 37 is located in the recessed portion 27 and is located rearward of the second wired portion 52. Referring to FIGS. 14 and 16, the first ground portion 33 is connected to the lower first ground conductor 77 of the first flat cable 66 under the connected state, and thereby the upper first ground plate 32 has a ground voltage same as those of the first ground conductors 77. The second ground portion 37 is connected to the lower second ground conductor 78 of the second flat cable 68 under the connected state, and thereby the second ground plate 36 has a ground voltage same as those of the second ground conductors 78.

Referring to FIG. 16, the first ground portion 33 and the second ground portion 37 of the present embodiment are connected to the first ground conductor 77 of the first flat cable 66 and the second ground conductor 78 of the second flat cable 68, respectively, under the connected state. However, the present invention is not limited thereto. For example, each of the first ground portion 33 and the second ground portion 37 may be connected to shield wires of a plurality of coaxial cables (not shown).

Referring to FIGS. 6 and 8, the first ground plates 32 of the connection body 22 of the present embodiment has a plurality of constant-potential wired portions 34 and a plurality of constant-potential terminal portions 35. The constant-potential wired portions 34 are divided into two rows in the front-rear direction. The constant-potential terminal portions 35 are divided into two rows in the upper-lower direction.

Referring to FIG. 14, each of the constant-potential wired portions 34 is exposed from the upper surface 252 of the body 25. The front constant-potential wired portions 34 are arranged in the lateral direction together with the first wired portions 42. The rear constant-potential wired portions 34 are arranged in the lateral direction together with the second wired portions 52. The arrangement of the front constant-potential wired portions 34 and the first wired portions 42 in the lateral direction is same as the arrangement of the constant-potential wires 73 and the first core wires 71 of the first flat cable 66. The front constant-potential wired portions 34 are fixed and connected to the constant-potential wires 73 of the first flat cable 66, respectively, via soldering, etc. under the connected state. The arrangement of the rear constant-potential wired portions 34 and the second wired portions 52 in the lateral direction is same as the arrangement of the constant-potential wires 73 and the second core wires 72 of the second flat cable 68. The rear constant-potential wired portions 34 are fixed and connected to the constant-potential wires 73 of the second flat cable 68, respectively, via soldering, etc. under the connected state.

Referring to FIGS. 14 and 15, the upper constant-potential terminal portions 35 are exposed from the upper surface 252 of the body 25 and are arranged in the lateral direction together with the first terminal portions 44. The lower constant-potential terminal portions 35 are exposed from the lower surface 254 of the body 25 and are arranged in the lateral direction together with the second terminal portions 54. Each of the upper constant-potential terminal portions 35 is fixed and connected to the upper terminal 86 of the connector 80 via soldering, etc. when the connection body 22 is connected to the connector 80. Each of the lower constant-potential terminal portions 35 is fixed and connected to the lower terminal 86 of the connector 80 via soldering, etc. when the connection body 22 is connected to the connector 80.

Figure 17:
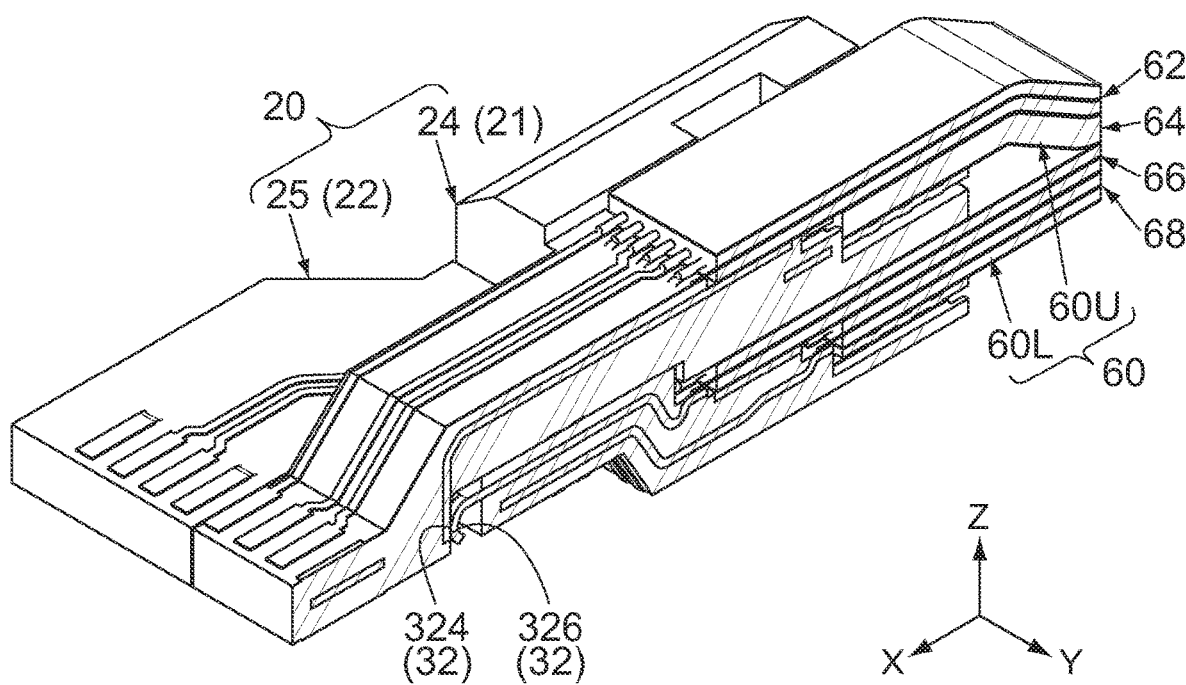
FIG. 17 is another partially-cut, perspective view showing the harness of FIG. 1, wherein the connector is not illustrated.

Referring to FIGS. 7 and 17, the first ground plates 32 of the two connection bodies 21 and 22 are connected to each other. In detail, the upper first ground plate 32 of the connection body 22 of the present embodiment is provided with two connection pieces 324. The connection pieces 324 are arranged in the lateral direction and extend downward from the upper first ground plate 32. Each of the connection pieces 324 is resiliently deformable. The first ground plate 32 of the connection body 21 of the present embodiment has two connected portions 326. The connected portions 326 are two parts of a surface of the first ground plate 32 facing rearward and are arranged in the lateral direction. The connection pieces 324 are pressed against the connected portions 326, respectively, and thereby the first ground plate 32 of the connection body 21 has a ground voltage same as that of the upper first ground plate 32 of the connection body 22.

Two of the first ground plates 32 of the connection structure 20 of the present embodiment are connected to each other as described above. However, the present invention is not limited thereto. The first ground plates 32 of the connection structure 20 may be connected to each other as necessary.

The present embodiment can be further variously modified in addition to the already explained modifications.

Figure 18:
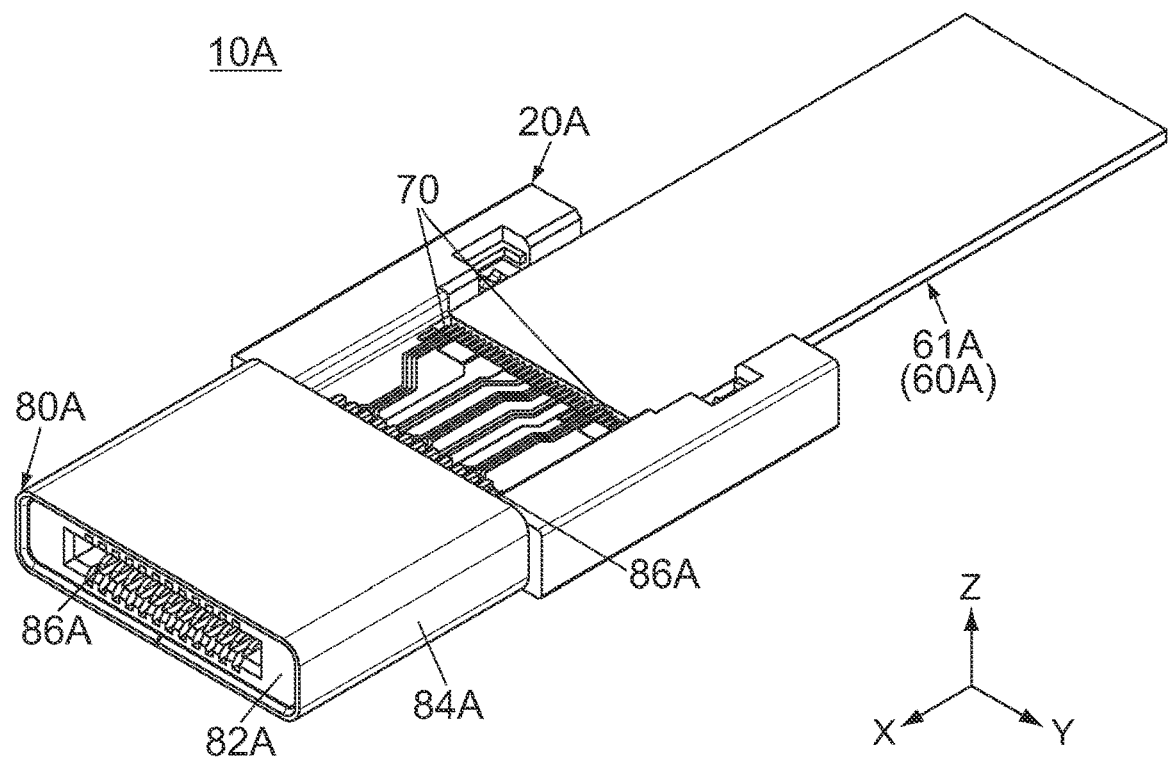
FIG. 18 is a perspective view showing a modification of the harness of FIG. 1.
Figure 19:
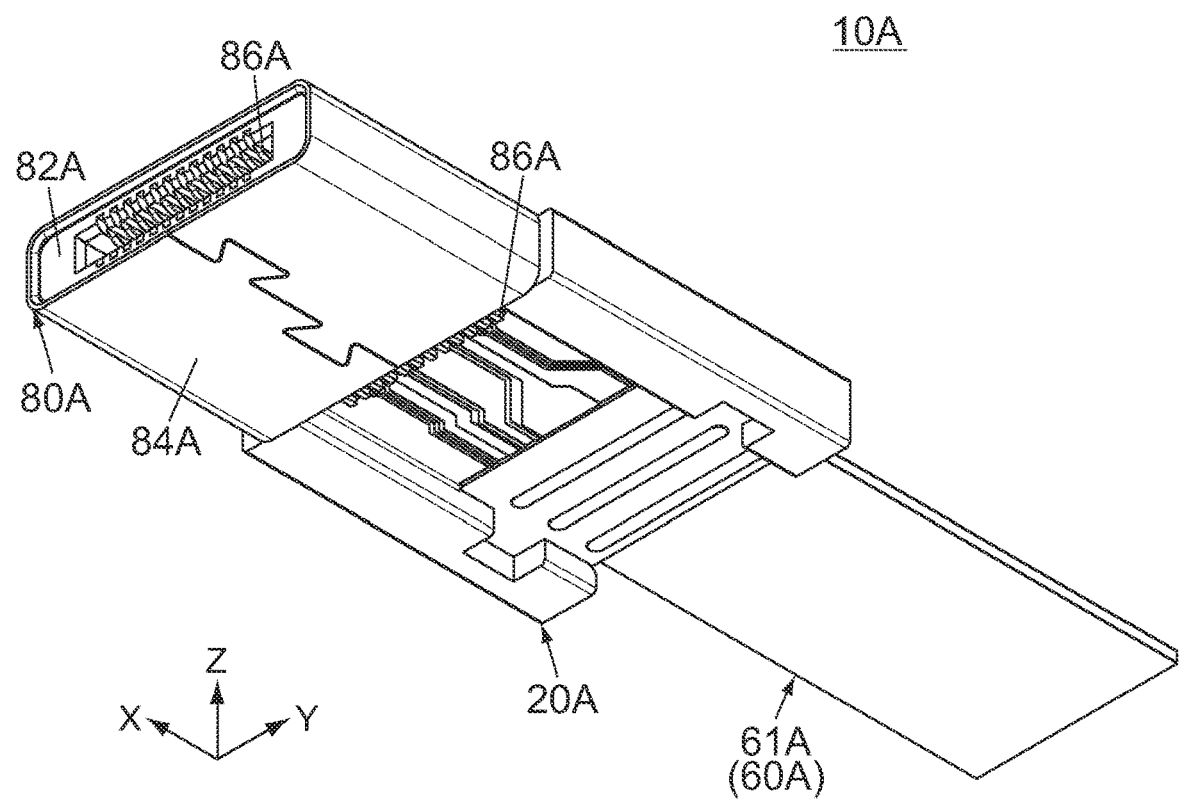
FIG. 19 is another perspective view showing the harness of FIG. 18.
Figure 20:
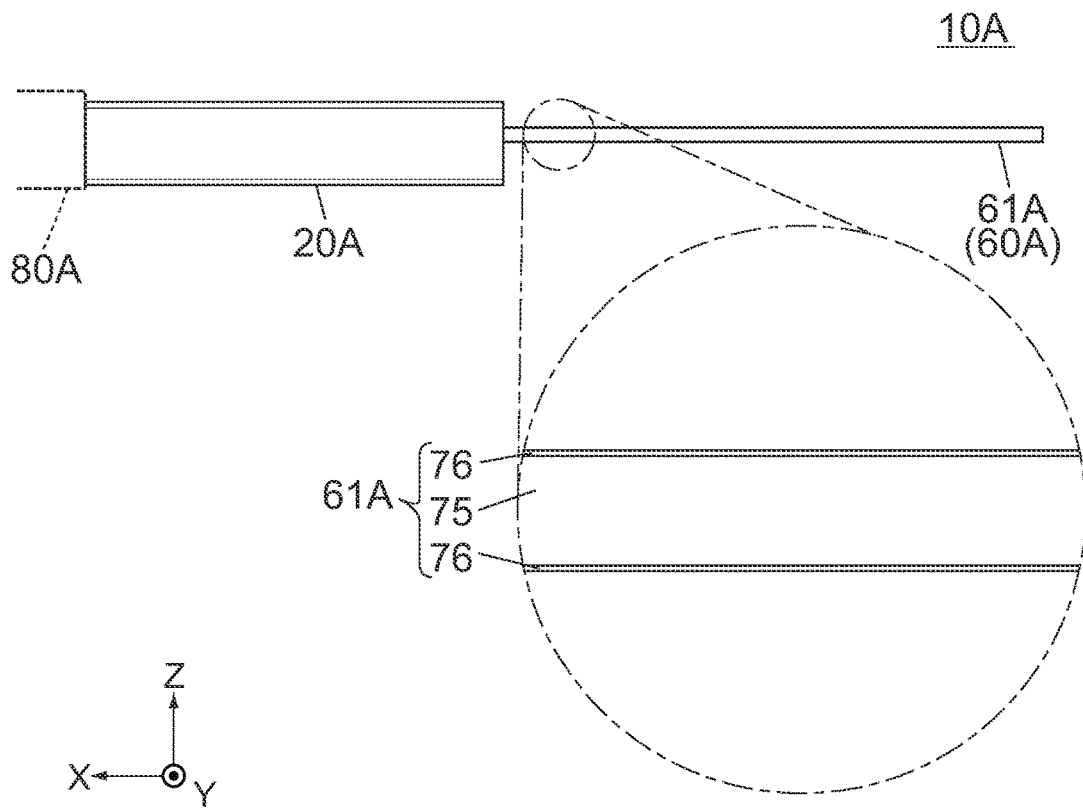
FIG. 20 is a side view showing the harness of FIG. 18, wherein an outline of a part of a connector is illustrated with dashed line, and a part of a cable structure enclosed by chain dotted lines is enlarged and illustrated.

As shown in FIGS. 18 to 20, a harness 10A according to a modification comprises a single connection body 20A. The harness 10A comprises a connector (object) 80A and a cable structure 60A in addition to the connection body 20A.

The connector 80A and the cable structure 60A are electrically connected with each other via the connection body 20A. The harness 10A can electrically connect an electronic device (not shown) and a mating electronic device (not shown) with each other similarly to the harness 10 (see FIG. 1). The harness 10A can be variously modified similarly to the harness 10.

The connector 80A of the present modification has a structure similar to that of the connector 80 (see FIG. 1). More specifically, the connector 80A comprises a housing 82A made of insulator, a shell 84A made of conductor such as metal and a plurality of terminals 86A each made of conductor such as metal. The structure of the connector 80A can be variously modified as necessary similarly to the connector 80.

The cable structure 60A of the present modification comprises only one flat cable 61A. The flat cable 61A has a rectangular shape in the YZ-plane, the rectangular shape being long in the lateral direction and thin in the upper-lower direction. The flat cable 61A comprises a plurality of core wires 70 each made of conductor and a holding portion 75 made of insulator. The core wires 70 are embedded in the holding portion 75. The core wires 70 are arranged in the lateral direction and are apart from each other in the lateral direction. Each of the core wires 70 is covered by the holding portion 75 in the YZ-plane and extends along the front-rear direction. Each of the core wires 70 has a front end which is exposed from the holding portion 75.

Figure 23:
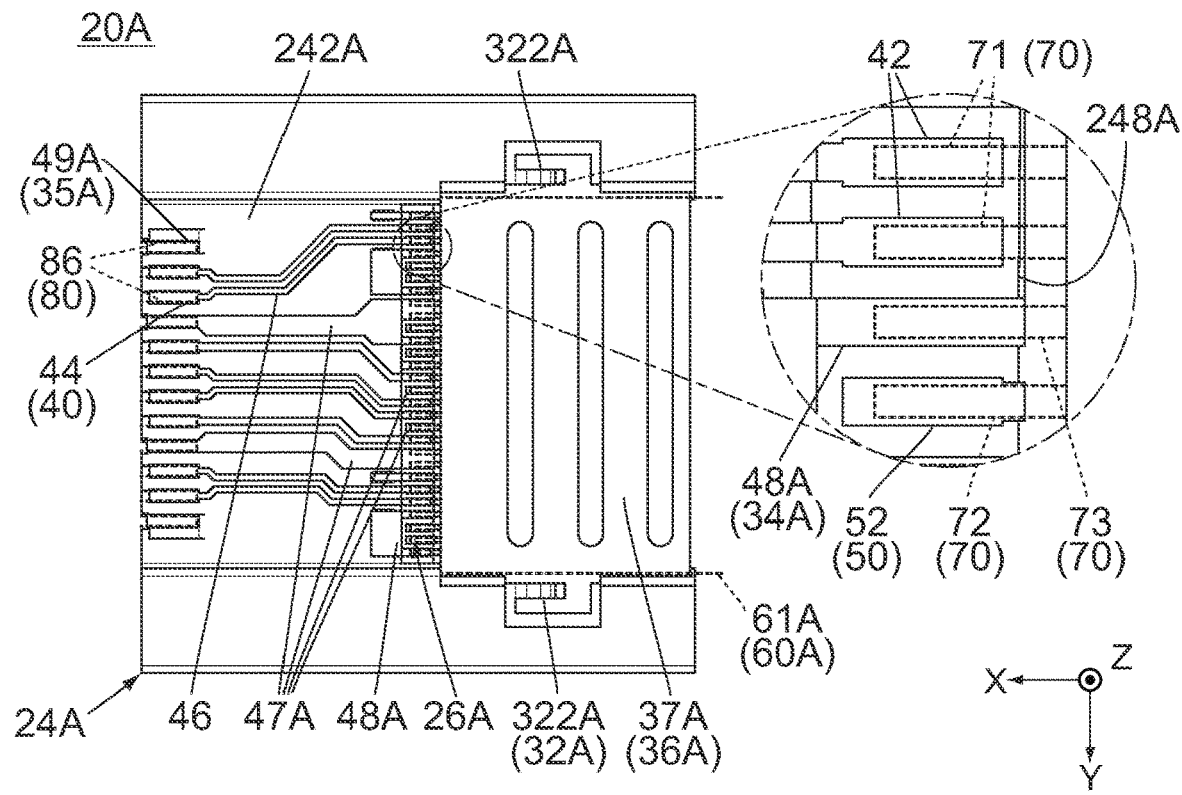
FIG. 23 is a top view showing the connection body of FIG. 21, wherein outlines of terminals of the connector and outlines of core wires of the cable structure are illustrated with dashed line, and a part of the connection body enclosed by chain dotted lines is enlarged and illustrated.

The flat cable 61A of the present modification includes two ground conductors 76 in addition to the core wires 70 and the holding portion 75. Each of the ground conductors 76 is formed of a thin metal sheet such as copper foil. Referring to FIG. 23, the core wires 70 of the flat cable 61A include one or more first core wires 71, one or more second core wires 72 and one or more constant-potential wires 73. Each of the first core wires 71 and the second core wires 72 of the present modification works as a signal wire. Each of the constant-potential wires 73 of the present modification is kept at a constant voltage such as a ground voltage.

Referring to FIGS. 18 to 20, the flat cable 61A of the present modification has the aforementioned structure. The two ground conductors 76 cover upper and lower surfaces of the holding portion 75, respectively, and electro-magnetically shield the core wires 70. However, the present invention is not limited thereto. For example, the structure of the flat cable 61A can be modified similarly to that of the flat cable 61 (see FIGS. 1 to 3).

Referring to FIGS. 21 to 25, the connection body 20A has a structure similar to that of the connection body 21 (see FIG. 4). More specifically, the connection body 20A comprises a body 24A made of insulator, one or more first paths 40 each made of conductor and one or more second paths 50 each made of conductor. Each of the first paths 40 and the second paths 50 is a conductive pattern formed on a surface of the body 24A. The connection body 20A of the present modification has the aforementioned basic structure. However, the present invention is not limited thereto. For example, the connection body 20A may further comprise another member in addition to the aforementioned members.

Referring to FIG. 23 together with FIG. 18, the connection body 20A is configured to be connected to a front end of the cable structure 60A in the front-rear direction, the cable structure 60A comprising one or more of the first core wires 71 and one or more of the second core wires 72.

Referring to FIGS. 21 to 25, the body 24A of the connection body 20A has an upper surface 242A, a lower surface 244A and a rear surface 248A. The upper surface 242A is an upper surface of the connection body 20A. The lower surface 244A is a lower surface of the connection body 20A. Thus, the upper surface 242A and the lower surface 244A are located at opposite sides of the body 24A in the upper-lower direction, respectively. The rear surface 248A faces rearward and couples the upper surface 242A and the lower surface 244A to each other in the upper-lower direction.

Figure 21:
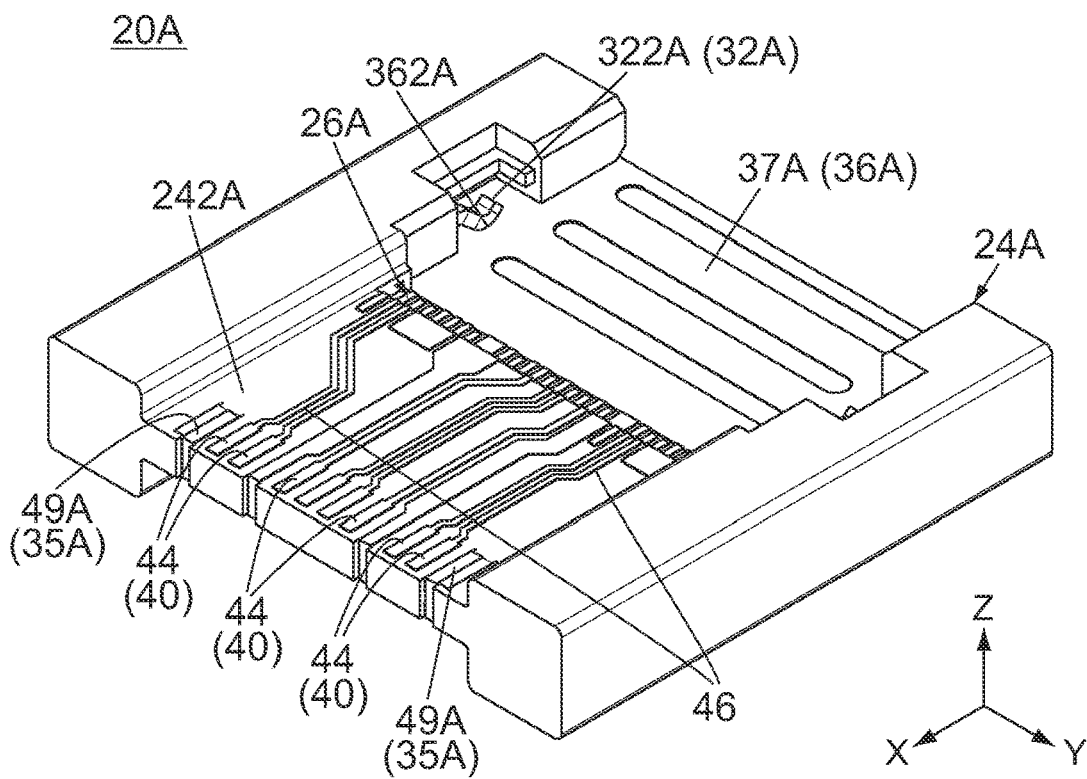
FIG. 21 is a perspective view showing a connection body of the harness of FIG. 18.

Referring to FIGS. 21 and 23, the body 24A of the present modification is formed with a recessed portion 26A which is recessed downward. The recessed portion 26A is located on a step formed in an upper side of the body 24A. The recessed portion 26A is a portion in which the core wires 70 of the flat cable 61A are wired. The thus-formed recessed portion 26A enables the flat cable 61A to be easily connected to the connection body 20A from above while the flat cable 61A extends along the front-rear direction. However, the present invention is not limited thereto, but the recessed portion 26A may be formed as necessary.

Referring to FIGS. 22 to 25, the rear surface 248A of the present modification is located at the middle of the body 24A in the front-rear direction. In detail, the rear surface 248A is located at a front end of the recessed portion 26A and extends in parallel to the YZ-plane. However, the present invention is not limited thereto. For example, the rear surface 248A may be a rear end surface of the body 24A.

Referring to FIG. 23, each of the first paths 40 has a first wired portion 42, a first terminal portion 44 and a first coupling portion 46. The first wired portions 42, the first terminal portions 44 and the first coupling portions 46 are formed on the upper surface 242A of the body 24A. Thus, all the first paths 40 of the connection body 20A are located on the upper surface 242A of the body 24A. The first wired portions 42 are located on the upper surface 242A of the recessed portion 26A and are arranged in the lateral direction. The first terminal portions 44 are located at a front end of the upper surface 242A and are arranged in the lateral direction. Thus, each of the first terminal portions 44 is located forward of the first wired portion 42. Each of the first coupling portions 46 extends between the first wired portion 42 and the first terminal portion 44 along the upper surface 242A. Thus, each of the first coupling portions 46 couples the first wired portion 42 and the first terminal portion 44 to each other.

Figure 24:
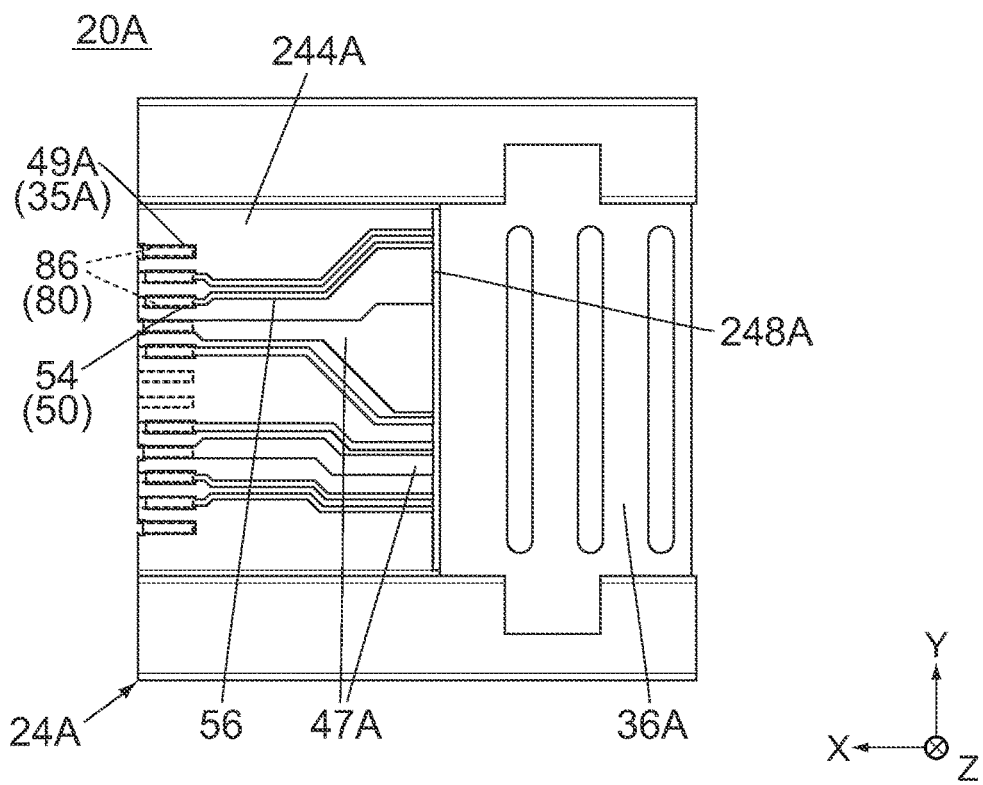
FIG. 24 is a bottom view showing the connection body of FIG. 21, wherein outlines of the terminals of the connector are illustrated with dashed line.
Figure 25:
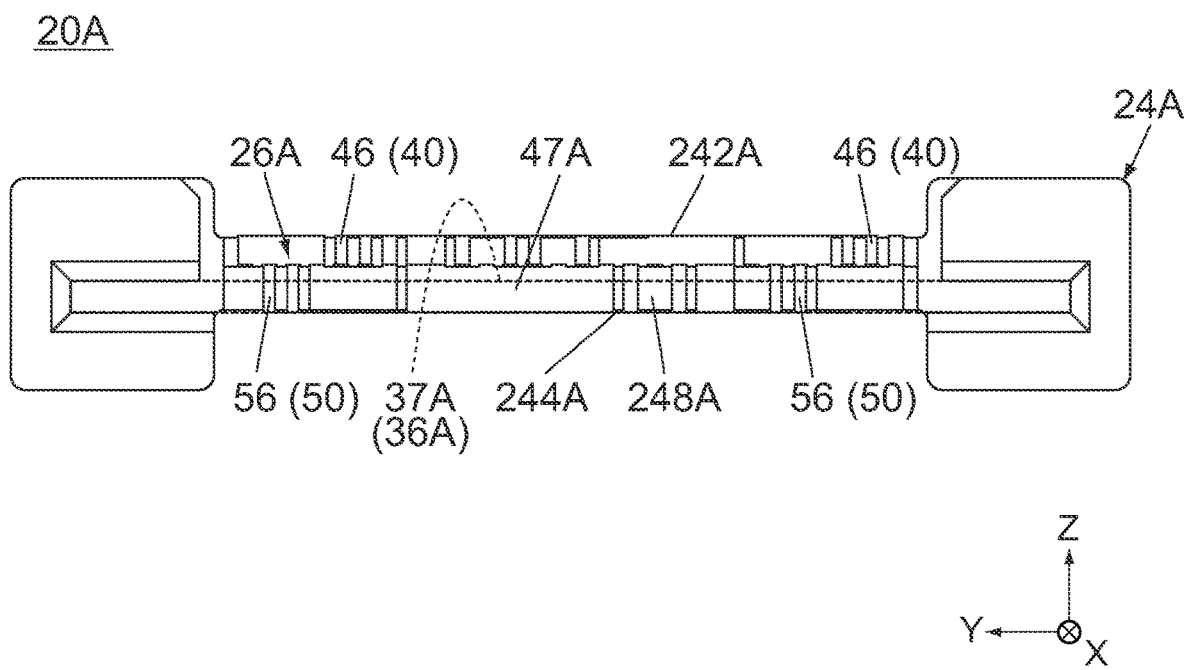
FIG. 25 is a rear view showing the connection body of FIG. 21, wherein an outline of a second ground plate is illustrated with dashed line.

Referring to FIGS. 23 to 25, each of the second paths 50 has a second wired portion 52, a second terminal portion 54 and a second coupling portion 56. All the second path 50 of the connection body 20A are located partially on the upper surface 242A of the body 24A, partially on the rear surface 248A and partially on the lower surface 244A.

In detail, the second wired portions 52 are formed on the upper surface 242A of the body 24A. The second terminal portions 54 are formed on the lower surface 244A of the body 24A. The second wired portions 52 are located on the upper surface 242A of the recessed portion 26A and are arranged in the lateral direction together with the first wired portions 42. Thus, the first wired portions 42 and the second wired portions 52 of the present modification are located at positions same as each other in the front-rear direction. The second terminal portions 54 are located at the front end of the lower surface 244A and are arranged in the lateral direction. Each of the second terminal portions 54 is located forward of the second wired portion 52. Each of the second coupling portions 56 extends between the second wired portion 52 and the second terminal portion 54 along the upper surface 242A, the rear surface 248A and the lower surface 244A. Thus, each of the second coupling portions 56 extends on the upper surface 242A, the rear surface 248A and the lower surface 244A of the body 24A and couples the second terminal portion 54 and the second wired portion 52 to each other.

Referring to FIG. 23, the first wired portions 42 are fixed and connected to the first core wires 71 of the cable structure 60A, respectively, via soldering, etc. under a connected state where the connection body 20A is connected to the cable structure 60A. The second wired portions 52 are fixed and connected to the second core wires 72 of the cable structure 60A, respectively, via soldering, etc. under the connected state. Each of the first terminal portions 44 is fixed and connected to the upper terminal 86A of the connector 80A via soldering, etc. when the connection body 20A is connected to the connector 80A. Referring to FIG. 24, each of the second terminal portions 54 is fixed and connected to the lower terminal 86A of the connector 80A via soldering, etc. when the connection body 20A is connected to the connector 80A.

Referring to FIGS. 23 and 24, according to the present modification, the first terminal portions 44 of the connection body 20A are provided on the upper surface 242A of the connection body 20A, while the second terminal portions 54 of the connection body 20A are provided on the lower surface 244A of the connection body 20A. The first terminal portions 44 and the second terminal portions 54 are connectable to the object 80A such as the connector 80A. Thus, both of the upper surface 242A and the lower surface 244A of the connection body 20A of the present modification are connectable to the object 80A.

In contrast, all the first wired portions 42 and all the second wired portions 52 of the connection body 20A are provided on the upper surface 242A of the connection body 20A. As described later, parts of the connection body 20A, which are configured to be connected to the constant-potential wires 73 of the cable structure 60A, are also provided on the upper surface 242A of the connection body 20A. According to this arrangement, when the first core wires 71, the second core wires 72 and the constant-potential wires 73 of the cable structure 60A are connected to the first wired portions 42, the second wired portions 52, etc., a cable fixing process such as soldering will be performed only for the upper surface 242A of the connection body 20A. Thus, the present modification provides the connection body 20A which has the upper surface 242A and the lower surface 244A both configured to be connected to the object 80A such as the connector 80A and which is easily connectable to the cable structure 60A.

The connection body 20A of the present modification is not formed with any through-holes at all. Upper and lower parts of each of the second paths 50 of the present modification can be vertically coupled to each other not via a through-hole but via a part of the second coupling portion 56 formed on the rear surface 248A of the connection body 20A. According to the coupling method of the present modification, the impedance of the second paths 50 can be easily adjusted. In addition, since there is no need to form openings of a through-hole on the upper surface 242A and the lower surface 244A, flexibility in design of the first paths 40 and the second paths 50 is improved.

Referring to FIG. 23, the first wired portions 42 and the second wired portions 52 of the present modification are connected to the first core wires 71 and the second core wires 72 of the flat cable 61A. However, the present invention is not limited thereto. For example, each of the first wired portions 42 and the second wired portions 52 may be connected to a core wire of a coaxial cable (not shown).

Figure 26:
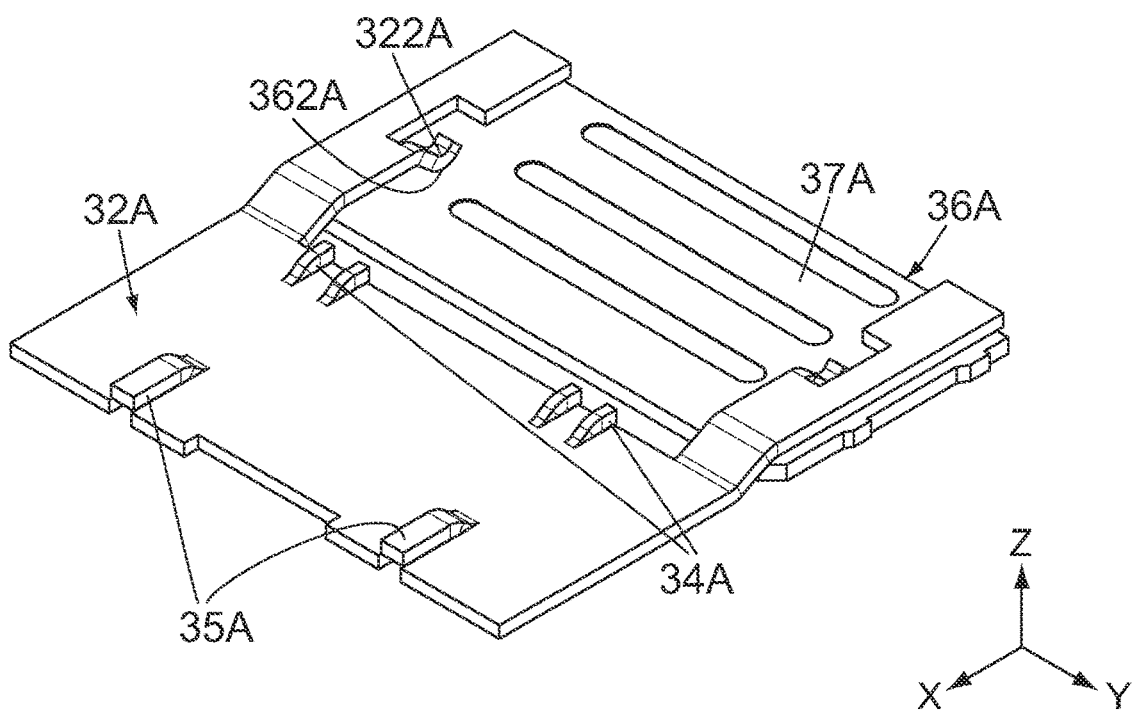
FIG. 26 is a perspective view showing ground plates of the connection body of FIG. 21.
Figure 27:
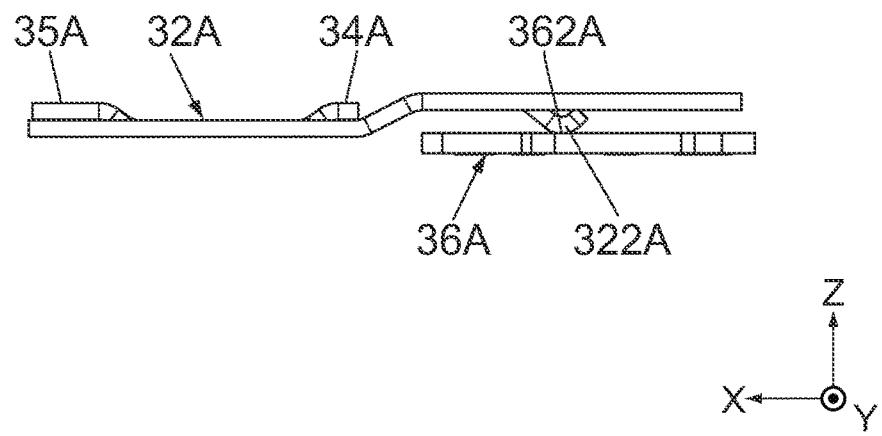
FIG. 27 is a side view showing the ground plates of FIG. 26.

Referring to FIGS. 21, 22, 26 and 27, the connection body 20A comprises one first ground plate 32A made of metal and one second ground plate 36A made of metal in addition to the body 24A, the first paths 40 and the second paths 50. Referring to FIGS. 26 and 27, each of the first ground plate 32A and the second ground plate 36A of the present modification has a thin flat-plate shape which is roughly in parallel to the XY-plane. The second ground plate 36A is located rearward of the first ground plate 32A.

Figure 22:
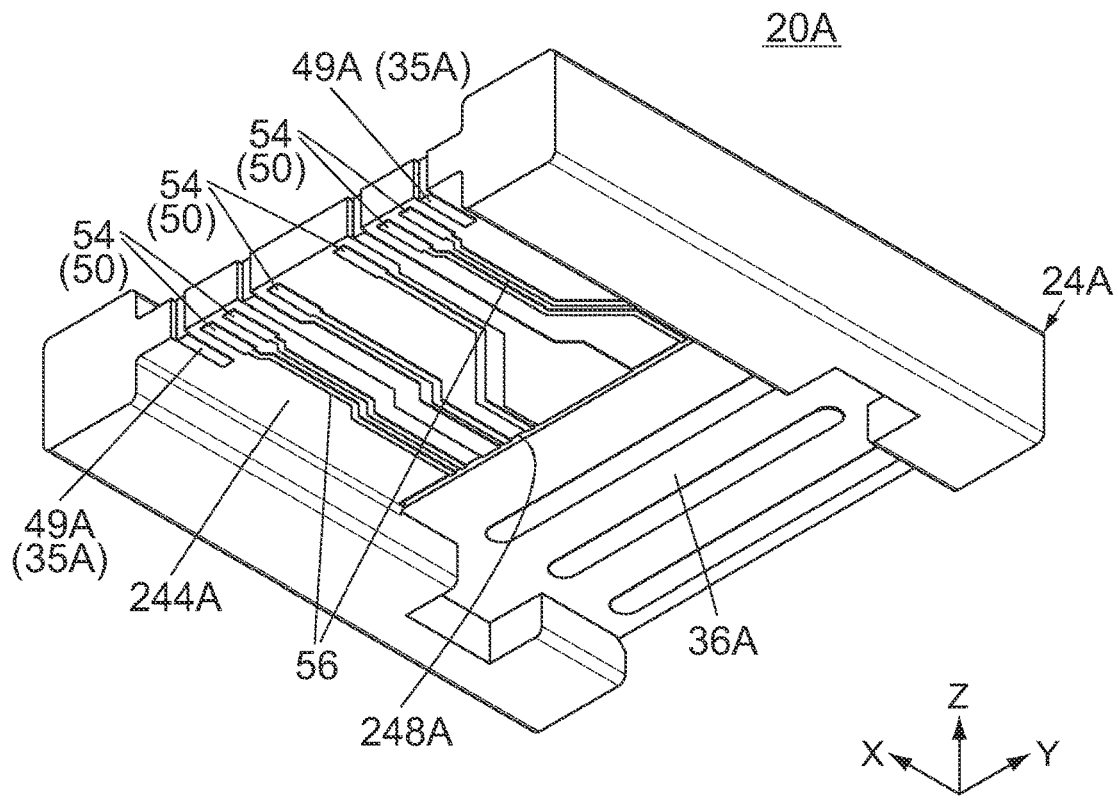
FIG. 22 is another perspective view showing the connection body of FIG. 21

Referring to FIG. 26 together with FIGS. 21 and 22, the first ground plate 32A is partially embedded in the body 24A so as to be located between the first paths 40 and the second paths 50 in the upper-lower direction. The second ground plate 36A is attached to the body 24A. In detail, the second ground plate 36A of the present modification is press-fit into the body 24A from behind and is located rearward of the recessed portion 26A.

The second ground plate 36A is connected to the first ground plate 32A. In detail, the first ground plate 32A of the present modification is provided with two connection pieces 322A. The connection pieces 322A are located at opposite sides of the first ground plate 32A in the lateral direction, respectively, and extend rearward. Each of the connection pieces 322A is resiliently deformable. The second ground plate 36A of the present modification has two connected portions 362A. The connected portions 362A are located at opposite sides of an upper surface of the second ground plate 36A in the lateral direction, respectively. The connection pieces 322A are pressed against the connected portions 362A, respectively, so that the first ground plate 32A has a ground voltage same as that of the second ground plate 36A.

The connection body 20A of the present modification comprises the first ground plate 32A and the second ground plate 36A which are arranged as described above. However, the present invention is not limited thereto. For example, the first ground plate 32A and the second ground plate 36A may be provided as necessary.

Referring to FIGS. 21 and 26, the connection body 20A of the present modification comprises a ground portion 37A. The ground portion 37A of the present modification is a part of the second ground plate 36A. In detail, the ground portion 37A is a part of the upper surface of the second ground plate 36A and faces upward. The ground portion 37A is connected to the ground conductor 76 (see FIG. 3) of the flat cable 61A under the connected state, and thereby the second ground plate 36A has a ground voltage same as those of the ground conductors 76. However, the present invention is not limited thereto. For example, the ground portion 37A may be connected to shield wires of a plurality of coaxial cables (not shown).

Figure 28:
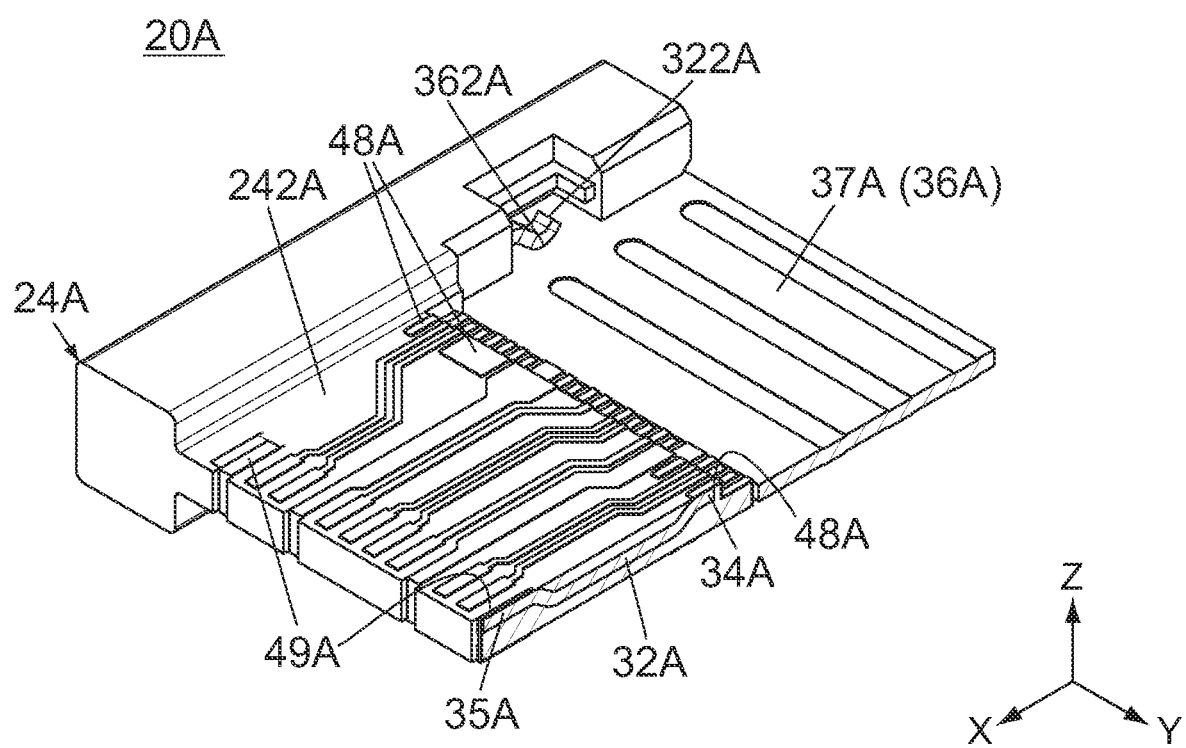
FIG. 28 is a partially cut-away, perspective view showing the connection body of FIG. 21.
Figure 29:
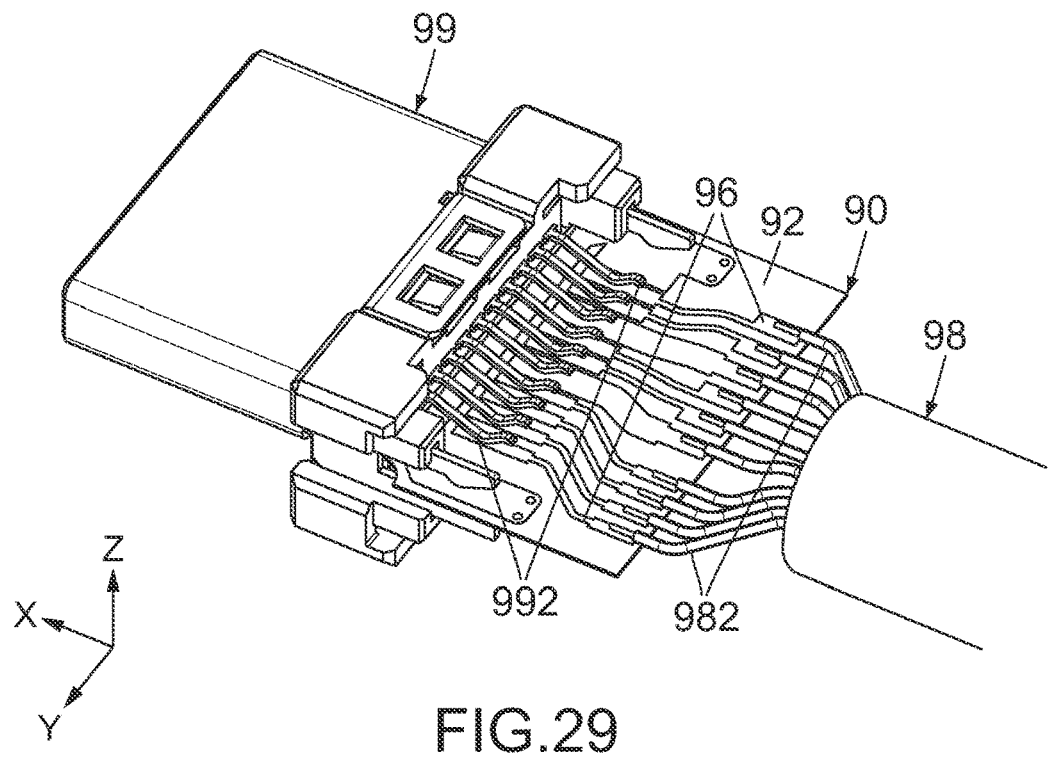
FIG. 29 is a perspective view showing a connection body of Patent Document 1 together with a connector and a cable.
Figure 30:
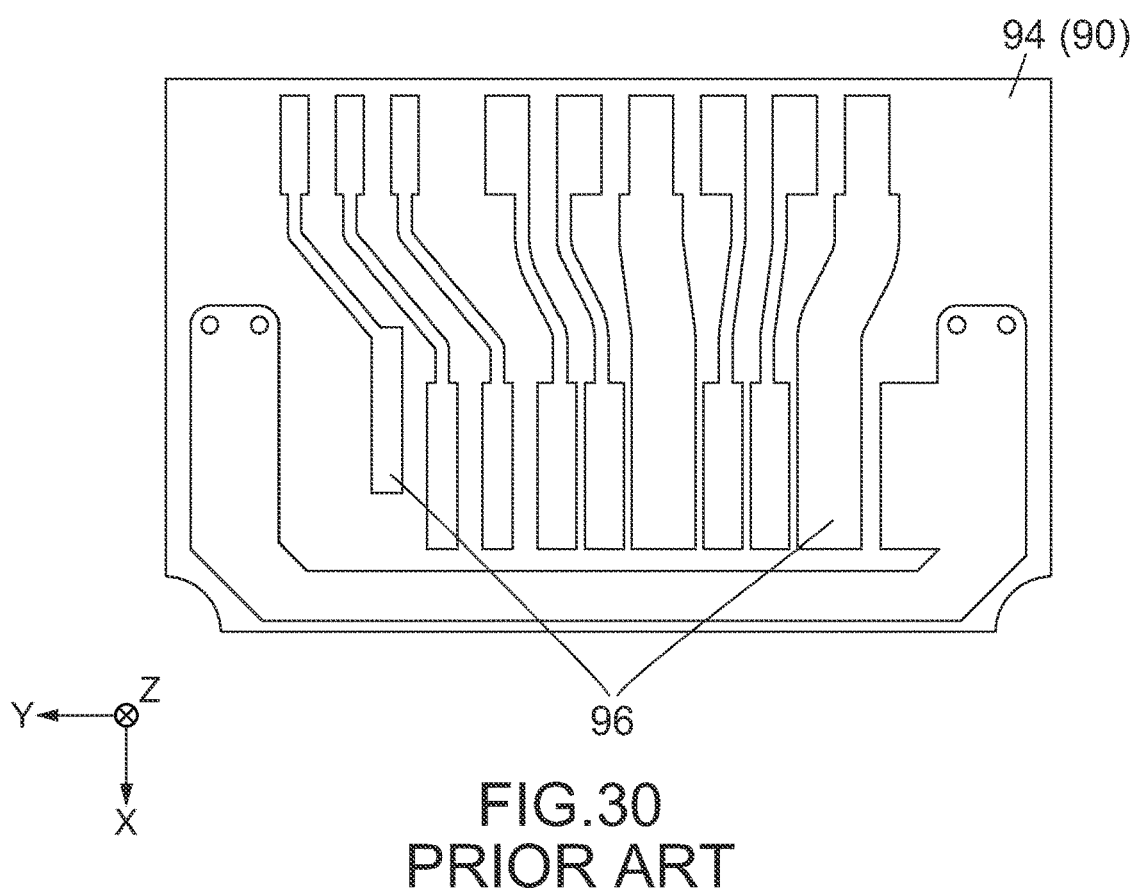
FIG. 30 is a bottom view showing the connection body of FIG. 29.

Referring to FIGS. 26 and 27, the first ground plate 32A of the present modification has a plurality of constant-potential wired portions 34A and a plurality of constant-potential terminal portions 35A. Referring to FIGS. 23 and 28, the constant-potential wired portions 34A are exposed from the upper surface 242A of the body 24A and are arranged in the lateral direction together with the first wired portions 42 and the second wired portions 52. The constant-potential terminal portions 35A are exposed from the upper surface 242A of the body 24A and are arranged in the lateral direction together with the first terminal portions 44.

Referring to FIGS. 23 to 25, the body 24A is formed with one or more constant-potential paths 47A, one or more conductive pads 48A and one or more conductive pads 49A in addition to the first paths 40 and the second paths 50.

The constant-potential paths 47A have rear ends which are located on the upper surface 242A and are arranged in the lateral direction together with the first wired portions 42 and the second wired portions 52. Some of the constant-potential paths 47A extend forward along the upper surface 242A so that they have front ends which are located on the upper surface 242A and are arranged in the lateral direction together with the first terminal portions 44. The other some of the constant-potential paths 47A extend forward along the rear surface 248A and the lower surface 244A so that they have front ends which are located on the lower surface 244A and are arranged in the lateral direction together with the second terminal portions 54. Referring to FIGS. 23, 24 and 28, each of the conductive pads 48A is formed on the upper surface 242A of the body 24A so as to cover one or more of the constant-potential wired portions 34A. The conductive pads 49A are formed on the upper surface 242A and the lower surface 244A of the body 24A so as to cover the constant-potential terminal portions 35A, respectively, Some of the constant-potential wires 73 of the flat cable 61A are fixed and connected to the conductive pads 48A via soldering, etc. under the connected state. The other some of the constant-potential wires 73 of the flat cable 61A are fixed and connected to the rear ends of the constant-potential paths 47A via soldering, etc. under the connected state.

Referring to FIGS. 18 to 20, the connector 80A is connected to a front end of the connection body 20A. In detail, referring to FIG. 23, each of the upper terminals 86A of the connector 80A is connected to one of the first terminal portions 44, the conductive pads 49A and the front ends of the constant-potential paths 47A which are located on the upper surface 242A of the connection body 20A. Referring to FIG. 24, each of the lower terminals 86A of the connector 80A is connected to one of the second terminal portions 54, the conductive pads 49A and the front ends of the constant-potential paths 47A which are located on the lower surface 244A of the connection body 20A.

The cable structure 60A of the present modification includes only the single flat cable 61A which is wide in the lateral direction. According to the present modification, the cable structure 60A can be reduced in size in the upper-lower direction. The present modification is preferable in a situation where the size of the cable structure 60A in the lateral direction is not specifically restricted while the size of the cable structure 60A in the upper-lower direction is required to be small.

What is claimed is:

1. A connection body configured to be connected to a front end of a cable structure in a front-rear direction, the cable structure comprising one or more first core wires and one or more second core wires, wherein:
    the connection body comprises a body made of insulator, one or more first paths each made of conductor and one or more second paths each made of conductor;
    the body has an upper surface, a lower surface and a rear surface;
    the upper surface and the lower surface are located at opposite sides of the body, respectively, in an upper-lower direction perpendicular to the front-rear direction;
    the rear surface faces rearward and couples the upper surface and the lower surface to each other in the upper-lower direction;
    each of the first paths has a first wired portion, a first terminal portion and a first coupling portion;
    the first wired portions are connected to the first core wires of the cable structure, respectively, under a connected state where the connection body is connected to the cable structure;
    the first wired portions, the first terminal portions and the first coupling portions are formed on the upper surface of the body;
    each of the first terminal portions is located forward of the first wired portion;
    each of the first coupling portions couples the first wired portion and the first terminal portion to each other;
    each of the second paths has a second wired portion, a second terminal portion and a second coupling portion;
    the second wired portions are connected to the second core wires of the cable structure, respectively, under the connected state;
    the second wired portions are formed on the upper surface of the body;
    the second terminal portions are formed on the lower surface of the body;
    each of the second terminal portions is located forward of the second wired portion; and
    each of the second coupling portions extends on the upper surface, the rear surface and the lower surface and couples the second wired portion and the second terminal portion to each other.

2. The connection body as recited in claim 1, wherein each of the first wired portions is located forward of the second wired portion and is located above the second wired portion.

3. The connection body as recited in claim 2, wherein:
    the cable structure includes a first flat cable and a second flat cable;
    the first flat cable includes the first core wires and a first ground conductor;
    the second flat cable includes the second core wires and a second ground conductor;
    the connection body comprises a first ground portion and a second ground portion;
    the first ground portion is located between the first wired portions and the second wired portions in the front-rear direction;
    the second ground portion is located rearward of the second wired portions;
    the first ground portion is connected to the first ground conductor under the connected state; and
    the second ground portion is connected to the second ground conductor under the connected state.

4. The connection body as recited in claim 3, wherein:
    the connection body comprises a first ground plate and a second ground plate;
    the first ground plate is partially embedded in the body;
    the second ground portion is attached to the body and is connected to the first ground plate;
    the first ground portion is a part of the first ground plate; and
    the second ground portion is a part of the second ground plate.

5. The connection body as recited in claim 4, wherein the second ground plate is apart from the second coupling portions and partially covers the second coupling portions from above.

6. A harness comprising the connection body as recited in claim 1, wherein:
    the harness comprises a connector and a cable structure in addition to the connection body;
    the connector is connected to a front end of the connection body; and
    the cable structure is connected to a rear end of the connection body.

7. A harness comprising two connection bodies each of which is the connection body as recited in claim 4, wherein:
    the two connection bodies are combined with each other;
    the harness comprises a connector and a cable structure in addition to the two connection bodies;
    the connector is connected to front ends of the two connection bodies;
    the cable structure includes two sets each consisting of a first flat cable and a second flat cable;
    the first flat cable and the second flat cable of one of the two sets are connected to a rear end of one of the two connection bodies; and
    the first flat cable and the second flat cable of a remaining one of the two sets are connected to a rear end of a remaining one of the two connection bodies.

8. The harness as recited in claim 7, wherein the first ground plates of the two connection bodies are connected to each other.

\* \* \* \* \*